US011831063B2

(12) United States Patent
Koyama et al.

(10) Patent No.: US 11,831,063 B2
(45) Date of Patent: Nov. 28, 2023

(54) ELEMENT HAVING ANTENNA ARRAY STRUCTURE

(71) Applicant: CANON KABUSHIKI KAISHA, Tokyo (JP)

(72) Inventors: Yasushi Koyama, Kanagawa (JP); Yoshinori Tateishi, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/674,572

(22) Filed: Feb. 17, 2022

(65) Prior Publication Data

US 2022/0173515 A1 Jun. 2, 2022

Related U.S. Application Data

(63) Continuation of application No. PCT/JP2020/028567, filed on Jul. 22, 2020.

(30) Foreign Application Priority Data

Aug. 23, 2019 (JP) .................. 2019-152828

(51) Int. Cl.
*H01Q 9/04* (2006.01)
*H03B 7/08* (2006.01)
(Continued)

(52) U.S. Cl.
CPC ....... *H01Q 9/0414* (2013.01); *G01R 31/2831* (2013.01); *G01R 31/311* (2013.01);
(Continued)

(58) Field of Classification Search
CPC ...... H01Q 9/0414; H01Q 21/065; H01Q 1/38; H01Q 9/16; H03B 7/146; H03B 7/08;
(Continued)

(56) References Cited

U.S. PATENT DOCUMENTS 7,924,107 B2 4/2011 Koyama et al.
8,896,389 B2 11/2014 Koyama et al.
(Continued)

FOREIGN PATENT DOCUMENTS

JP H05-67919 A 3/1993
JP 2008-011490 A 1/2008
(Continued)

OTHER PUBLICATIONS

Hidetoshi Kanaya et al, "Fundamental Oscillation up to 1.42 THz in Resonant Tunneling Diodes by Optimized Collector Spacer Thickness", J Infrared Milli Terahz Waves (2014) 35 425-431.
(Continued)

*Primary Examiner* — Arnold M Kinkead
(74) *Attorney, Agent, or Firm* — VENABLE LLP

(57) ABSTRACT

An element includes a coupling line in which a first conductor layer, a dielectric layer, and a second conductor layer are stacked in this order, and which is connected to the second conductor layer in order to mutually synchronize a plurality of antennas at a frequency of a terahertz wave; and a bias line connecting a power supply for supplying a bias signal to a semiconductor layer and the second conductor layer. A wiring layer in which the coupling line is formed and a wiring layer in which the bias line is formed are different layers. The bias line is disposed in a layer between the first conductor layer and the second conductor layer.

17 Claims, 26 Drawing Sheets

(51) Int. Cl.
*H03B 7/14* (2006.01)
*H01Q 9/16* (2006.01)
*H01Q 21/06* (2006.01)
*H03B 7/12* (2006.01)
*G01R 31/311* (2006.01)
*H01Q 1/38* (2006.01)
*G01R 31/28* (2006.01)
*H03B 5/12* (2006.01)
*H03L 7/099* (2006.01)
*H03L 7/10* (2006.01)
*H03L 7/193* (2006.01)

(52) U.S. Cl.
CPC .............. *H01Q 1/38* (2013.01); *H01Q 9/16* (2013.01); *H01Q 21/065* (2013.01); *H03B 5/1212* (2013.01); *H03B 5/1228* (2013.01); *H03B 5/1243* (2013.01); *H03B 5/1265* (2013.01); *H03B 5/1293* (2013.01); *H03B 7/08* (2013.01); *H03B 7/12* (2013.01); *H03B 7/146* (2013.01); *H03L 7/099* (2013.01); *H03L 7/101* (2013.01); *H03L 7/103* (2013.01); *H03L 7/193* (2013.01); *H03B 2200/0084* (2013.01)

(58) Field of Classification Search
CPC .............. H03B 2200/0084; H03B 7/12; H03B 5/1228; H03B 5/1243; H03B 5/1265; H03B 5/1212; G01R 31/311; G01R 31/2831; G01S 13/584; G01S 7/4056; G01S 13/931; H03L 7/099; H03L 7/101; H03L 7/103; H03L 7/193
USPC ...................... 331/107 T, 96, 132, 115, 105; 343/700 MS
See application file for complete search history.

(56) References Cited

U.S. PATENT DOCUMENTS

| | | | |
|---|---|---|---|
| 9,184,697 | B2 | 11/2015 | Sekiguchi et al. |
| 9,391,428 | B2 | 7/2016 | Koyama et al. |
| 9,899,959 | B2 | 2/2018 | Feiginov et al. |
| 10,897,073 | B2 | 1/2021 | Sato et al. |
| 2014/0266477 | A1 | 9/2014 | Sekiguchi |
| 2015/0303559 | A1 | 10/2015 | Tateishi |
| 2016/0344343 | A1* | 11/2016 | Feiginov ............ H03B 7/08 |
| 2020/0293806 | A1 | 9/2020 | Sato et al. |
| 2020/0296265 | A1 | 9/2020 | Itsuji et al. |
| 2020/0296266 | A1 | 9/2020 | Koyama et al. |
| 2021/0091722 | A1 | 3/2021 | Koyama |

FOREIGN PATENT DOCUMENTS

| | | |
|---|---|---|
| JP | 2008-306523 A | 12/2008 |
| JP | 2011-135006 A | 7/2011 |
| JP | 2012-044688 A | 3/2012 |
| JP | 2014-266477 A1 | 9/2014 |
| JP | 2014-200065 A | 10/2014 |
| JP | 2019-33464 A | 2/2019 |

OTHER PUBLICATIONS

Miasahiro Asada et al, "Resonant Tunneling Diodes for Sub-Terahertz and Terahertz Oscillators", Jpn. J. Appl. Phys., vol. 47, No. 6 (2008) pp. 4375-4384.

Miasahiro Asada et al, "Theoretical analysis of coupled oscillator array using resonant tunneling diodes in subterahertz and terahertz range", J.Appl.Phys., vol. 103, 124514 (2008).

International Search Report dated Aug. 17, 2023, in corresponding European Application No. EP20856549.9.

* cited by examiner

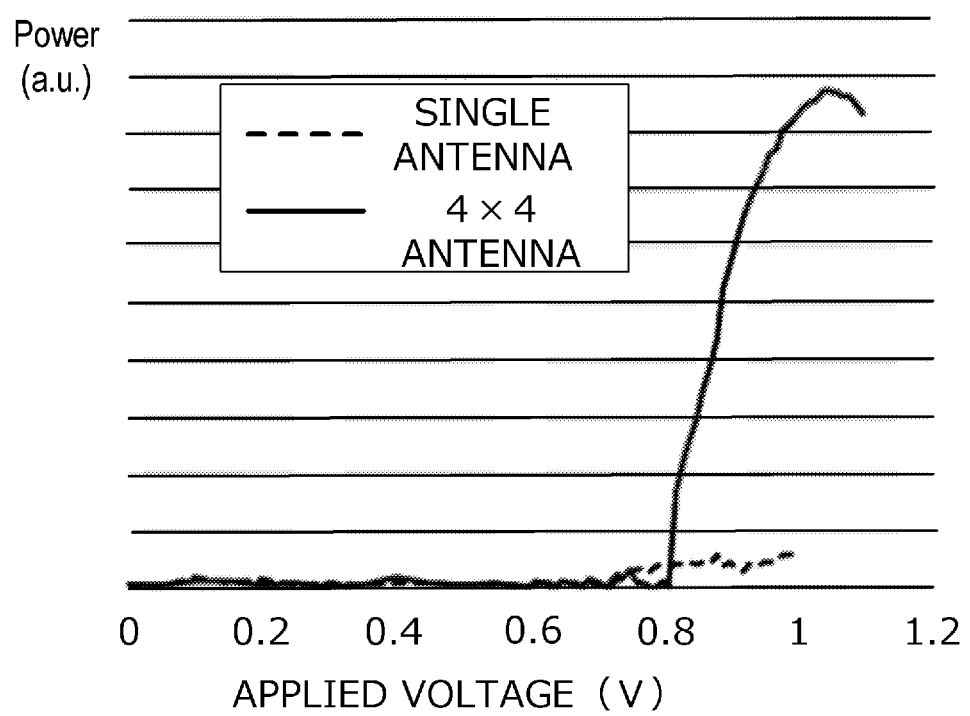

ELEMENT HAVING ANTENNA ARRAY STRUCTURE

CROSS-REFERENCE TO RELATED APPLICATIONS

This application is a Continuation of International Patent Application No. PCT/JP2020/028567, filed Jul. 22, 2020, which claims the benefit of Japanese Patent Application No. 2019-152828, filed Aug. 23, 2019, both of which are hereby incorporated by reference herein in their entirety.

BACKGROUND OF THE INVENTION

Field of the Invention

The present invention relates to an element.

Background Art

As a current injection type light source that produces an electromagnetic wave in the frequency range of at least 30 GHz and not more than 30 THz (hereinafter referred to as "terahertz wave"), there is known an oscillator in which a semiconductor element having an electromagnetic wave gain for the terahertz wave and a resonator are integrated. Among oscillators of such kind, an oscillator in which a resonant tunneling diode (RTD) and an antenna are integrated is expected as an element that operates at room temperature in a frequency range around 1 THz.

PTL 1 discloses an antenna array for the terahertz wave in which a plurality of oscillators, in each of which an RTD and an antenna are integrated, are arranged on the same substrate.

In the antenna array disclosed in PTL 1, an increase in antenna gain can be expected by increasing the number of antennas and synchronizing the antennas. On the other hand, coupling lines for coupling the adjacent antennas for synchronizing the oscillators and bias lines for supplying a bias signal to the RTDs are required. Accordingly, as the number of antennas increases, the risk of electrical and mechanical interference between the coupling line and the bias line for each antenna increases. Therefore, since there is a limit to the number of antennas that can be arranged, resulting in a limit to the effect of enhancing the power and gain by the antenna array, this makes it impossible to efficiently produce and detect a terahertz wave.

SUMMARY OF THE INVENTION

In view of the above-described problems, a purpose of the present disclosure of technology is to provide efficient generation or detection of a terahertz wave in an element having an antenna array structure.

A first aspect of the present disclosure is: an element including: an antenna array in which a plurality of antennas are arranged, with each of the antennas including a first conductor layer, a semiconductor layer that is electrically connected to the first conductor layer and produces or detects a terahertz wave, a second conductor layer that is electrically connected to the semiconductor layer and faces the first conductor layer via the semiconductor layer, and a dielectric layer that is located between the first conductor layer and the second conductor layer; a coupling line that is connected to the second conductor layer configured to make mutual synchronization between the plurality of antennas at a frequency of the terahertz wave; and a bias line that connects a power source for supplying a bias signal to the semiconductor layer and the second conductor layer, wherein a wiring layer in which the coupling line is formed and a wiring layer in which the bias line is formed are different layers, and the bias line is disposed in a layer between the first conductor layer and the second conductor layer.

A second aspect of the present disclosure is: an element including: an antenna array in which a plurality of antennas are arranged, with each of the antennas including a first conductor layer, a semiconductor layer that is electrically connected to the first conductor layer and produces or detects a terahertz wave, a second conductor layer that is electrically connected to the semiconductor layer and faces the first conductor layer via the semiconductor layer, and a dielectric layer that is located between the first conductor layer and the second conductor layer; a coupling line that is connected to the second conductor layer configured to make mutual synchronization between the plurality of antennas at a frequency of the terahertz wave; and a bias line that connects a power source for supplying a bias signal to the semiconductor layer and the second conductor layer, wherein a wiring layer in which the coupling line is formed and a wiring layer in which the bias line is formed are different layers, the element further comprising a third conductor layer and a fourth conductor layer, wherein the coupling line is formed of the third conductor layer and the first conductor layer, the bias line is formed of the fourth conductor layer, the third conductor layer and the fourth conductor layer are arranged in different layers, and the first conductor layer, the third conductor layer, and the fourth conductor layer are stacked in this order.

A third aspect of the present disclosure is: an element including: an antenna array in which a plurality of antennas are arranged, with each of the antennas including a first conductor layer, a semiconductor layer that is electrically connected to the first conductor layer and produces or detects a terahertz wave, a second conductor layer that is electrically connected to the semiconductor layer and faces the first conductor layer via the semiconductor layer, and a dielectric layer that is located between the first conductor layer and the second conductor layer; a coupling line that is connected to the second conductor layer configured to make mutual synchronization between the plurality of antennas at a frequency of the terahertz wave; and a bias line that connects a power source for supplying a bias signal to the semiconductor layer and the second conductor layer, wherein a wiring layer in which the coupling line is formed and a wiring layer in which the bias line is formed are different layers, and adjacent antennas in the antenna array are connected to a common bias line disposed between the adjacent antennas.

Further features of the present invention will become apparent from the following description of exemplary embodiments with reference to the attached drawings.

BRIEF DESCRIPTION OF THE DRAWINGS

FIG. 14 is a graph showing the oscillation outputs of the oscillating element according to the second example and a single antenna;

DESCRIPTION OF THE EMBODIMENTS

Figure 1A:
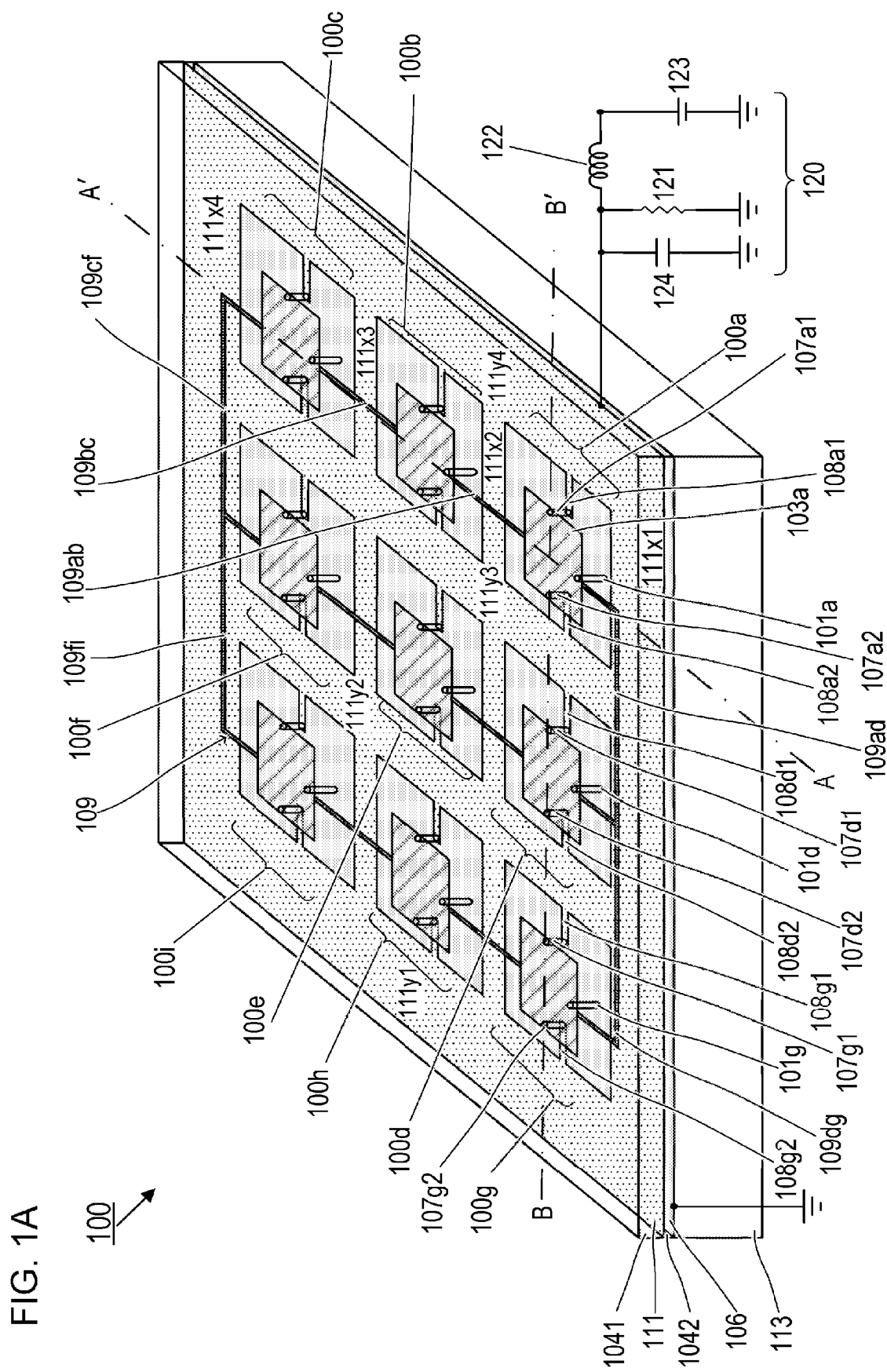
FIG. 1A is a diagram illustrating a semiconductor element according to a first embodiment.
Figure 1B:
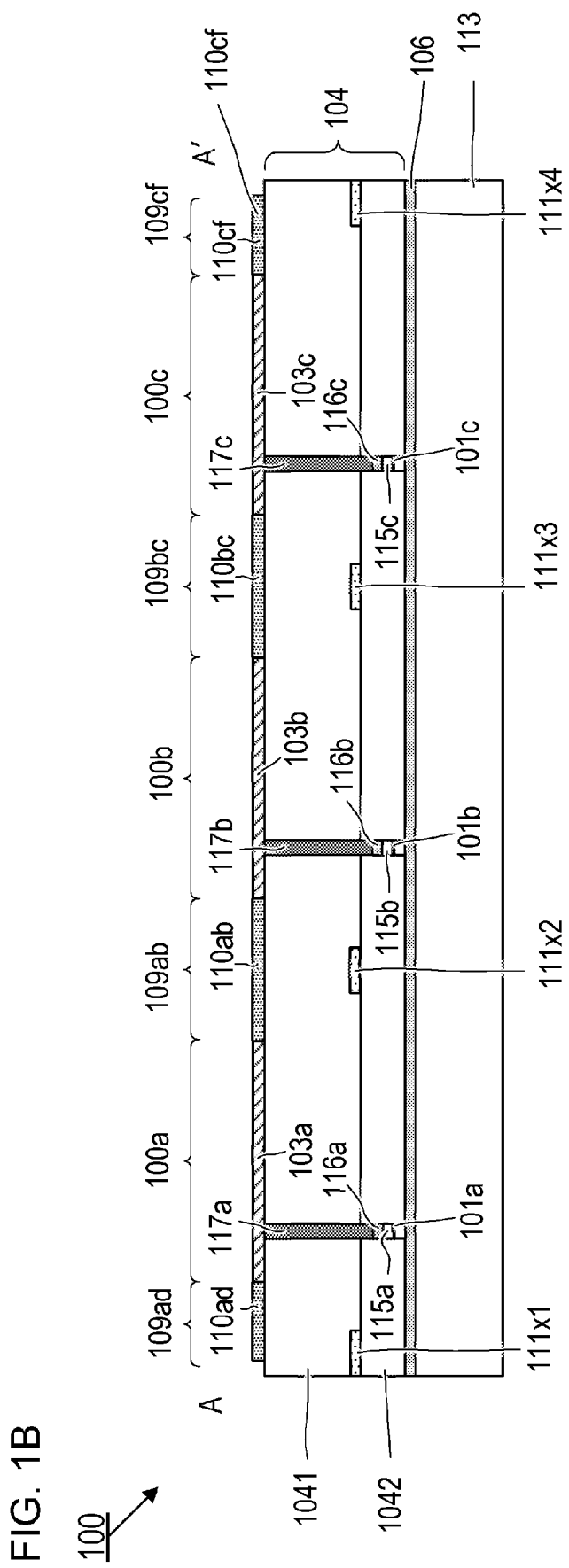
FIG. 1B is a diagram illustrating the semiconductor element according to the first embodiment.
Figure 1C:
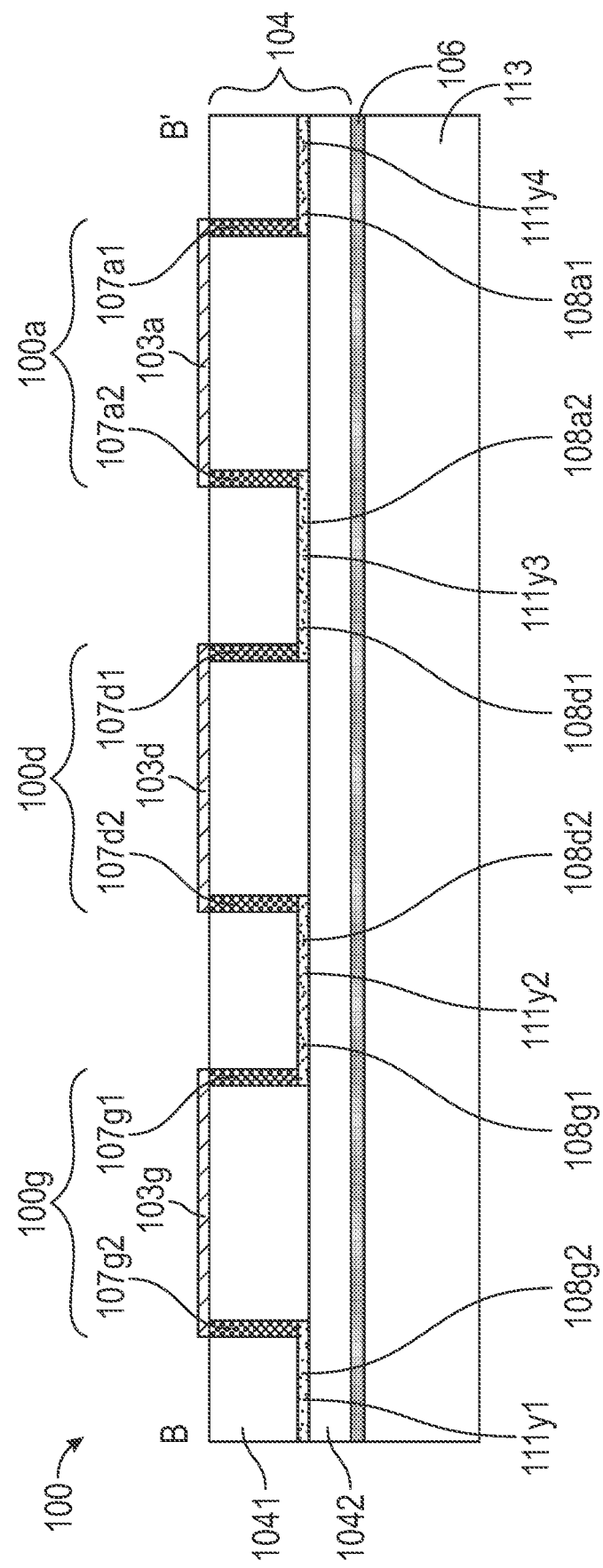
FIG. 1C is a diagram illustrating the semiconductor element according to the first embodiment.
Figure 2:
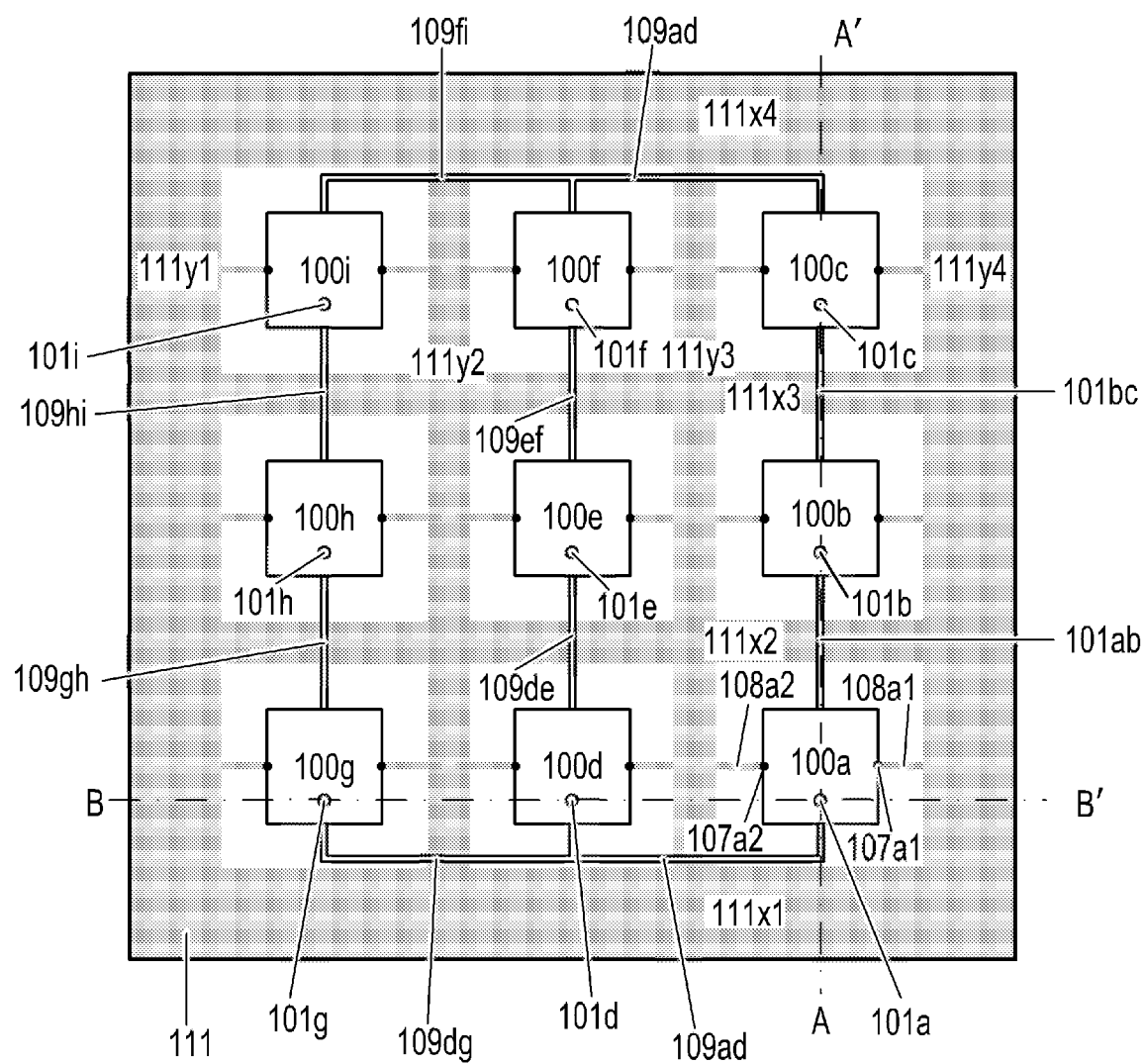
FIG. 2 is a top view of the semiconductor element according to the first embodiment.

<First Embodiment>: A semiconductor element 100 according to a first embodiment will be described with reference to FIGS. 1A to 2C. The semiconductor element 100 is a semiconductor element that produces an oscillating terahertz wave at a frequency of $f_{THz}$ or detects a terahertz wave. FIG. 1A is a perspective view illustrating the appearance of the semiconductor element 100, FIG. 1B is a sectional view, taken along line A-A', of the semiconductor element 100, and FIG. 1C is a sectional view, taken along line B-B', of the semiconductor element 100. FIG. 2 is a top view of the semiconductor element 100 as viewed from the stacking direction of the semiconductor element (from above). Note that, in the following description, an example of the semiconductor element 100 being used as an oscillator will be described. Here, the terahertz wave is an electromagnetic wave in the frequency range of at least 30 GHz and not more than 30 THz. Further, the length of each of the components of the semiconductor element 100, such as a substrate 113, a dielectric layer 104, and a semiconductor layer 115, in the stacking direction of the components is referred to as "thickness" or "height". Further, the direction in which the dielectric layer 104 and the semiconductor layer 115 are located with respect to the substrate 113 is referred to as "upper".

The semiconductor element 100 is provided with a plurality of antennas. In the present embodiment, the semiconductor element 100 includes an antenna array in which nine antennas 100a, 100b, 100c, 100d, 100e, 100f, 100g, 100h, and 100i are arranged in a 3×3 matrix. The antenna 100a also serves as a resonator that resonates with the terahertz wave and a radiator that transmits or receives the terahertz wave. The antenna 100a has a semiconductor layer 115a for producing an oscillating electromagnetic wave of a terahertz wave or detecting an electromagnetic wave of a terahertz wave inside. Each of the other eight antennas 100b to 100i has the same configuration as the antenna 100a. Further, the antennas can be arranged at a pitch not more than the wavelength of the terahertz wave to be detected or produced or a pitch of an integral multiple of the wavelength.

Hereinafter, the configuration of the antenna 100a will be described in detail, and detailed description of the components of the other antennas 100b to 100i that are the same as or similar to those of the antenna 100a will be omitted. Further, throughout the description, to the end of the reference numeral for each component of the antennas 100a to 100i, the alphabet used for the corresponding antenna is appended. For example, among second conductor layers 103, the corresponding component of the antenna 100a is represented as a second conductor layer 103a.

(Antennas): The antenna 100a has a configuration in which the dielectric layer 104 is interposed between two conductor layers (wiring layers): a first conductor layer 106 and the second conductor layer 103a. Such a configuration is called a microstrip type antenna using a microstrip line having a finite length or the like. In the present embodiment, an example using a patch antenna which is a microstrip type resonator will be described.

The second conductor layer 103a is a patch conductor for the antenna 100a, disposed so as to face the first conductor layer 106 via the dielectric layer 104 (semiconductor layer 115a). The second conductor layer 103a is electrically connected to the semiconductor layer 115a. The antenna 100a is configured to operate as a resonator in which the width of the second conductor layer 103a in the A-A' direction (resonance direction) is $\lambda_{THz}/2$. The first conductor layer 106 is a grounding conductor that is electrically grounded. Note that $\lambda_{THz}$ is the effective wavelength of the terahertz wave with which the antenna 100a resonates in the dielectric layer 104, and it is represented as $\lambda_{THz}=\lambda_0\times\varepsilon_r^{-1/2}$, where $\lambda_0$ is the wavelength of the terahertz wave in vacuum, and $\varepsilon_r$ is the effective relative dielectric constant of the dielectric layer 104.

The semiconductor layer 115a includes an active layer 101a composed of a semiconductor layer having an electromagnetic wave gain or non-linearity for the terahertz wave. As a typical semiconductor layer having an electromagnetic wave gain in a frequency band of terahertz waves, there is known a resonant tunneling diode (RTD). In the present embodiment, an example in which an RTD is used as the active layer 101a will be described. Hereinafter, the active layer 101a is referred to as the RTD 101a.

The RTD 101a includes a resonance tunnel structure layer including a plurality of tunnel barrier layers, in which a quantum well layer is provided between the plurality of tunnel barriers, and has a multiple quantum well structure in which a terahertz wave is produced by intersubband transition of carriers. The RTD 101a has an electromagnetic wave gain in a frequency range of terahertz waves based on the photon-assisted tunneling phenomenon in the differential negative resistance region of the current-voltage characteristic, and self-oscillates in the differential negative resistance region.

The antenna 100a is an active antenna in which the semiconductor layer 115a including the RTD 101a and a patch antenna are integrated. The frequency $f_{THz}$ of the terahertz waves emitted from the antenna 100a alone is determined by the resonance frequency of an all-parallel resonant circuit in which the patch antenna and the reactance of the semiconductor layer 115a are combined. Specifically, from the equivalent circuit of the oscillator described in NPL 1, a frequency is determined, as the oscillation frequency $f_{THz}$, that satisfies an amplitude condition represented by Equation 1 and a phase condition represented by Equation 2 are satisfied for the resonance circuit in which the admittances of the RTD and the antenna ($Y_{RTD}$ and $Y_{aa}$) are combined.

$$Re[Y_{RTD}]+Re[Y_{aa}]\leq 0 \quad \text{(Equation 1)}$$

$$Im[Y_{RTD}]+Im[Y_{aa}]=0 \quad \text{(Equation 2)}$$

Here, $Y_{RTD}$ is the admittance of the semiconductor layer 115a, Re is a real part, and Im is an imaginary part. The semiconductor layer 115a includes the RTD 101a which is a negative resistance element as an active layer, and thus $Re[Y_{RTD}]$ has a negative value. Further, $Y_{aa}$ indicates the admittance of the entire structure of the patch antenna 100a in view of the semiconductor layer 115a.

Note that, as the active layer 101a, a quantum cascade laser (QCL) structure having a semiconductor multilayer structure of several hundred to several thousand layers may be used. In this case, the semiconductor layer 115a is a semiconductor layer including a QCL structure. Further, as the active layer 101a, a negative resistance element such as a Gunn diode or an IMPATT diode often used in the millimeter wave band may be used. Further, as the active layer 101a, a high frequency element such as a transistor with one terminal terminated may be used, and suitable transistors include a heterojunction bipolar transistor (HBT), a compound semiconductor layer FET, and a high electron mobility transistor (HEMT). Further, as the active layer 101a, the differential negative resistance of a Josephson element using superconductor layers may be used.

The dielectric layer 104 is composed of two layers: a first dielectric layer 1041 and a second dielectric layer 1042. In a microstrip type resonator such as a patch antenna, the large thickness of the dielectric layer 104 reduces conductor loss and improves radiation efficiency. The dielectric layer 104 is required to have a possible thick film (typically, 3 μm or more), a low loss and a low dielectric constant in a terahertz band, and a high ease of microfabrication (flattening and etching). Here, the radiation efficiency increases as the thickness of the dielectric layer 104 increases, but multimode resonance may occur if the thickness is too large. Therefore, it is preferable to design the thickness of the dielectric layer 104 in a range of up to 1/10 of the oscillation wavelength as the upper limit. On the other hand, since a miniaturized, high current density diode is necessary in order to increase the frequency and output of the oscillator, the dielectric layer 104 is required to prevent current leakage and address migration in order to serve as an insulating structure for the diode. In the present embodiment, in order to achieve the above two purposes, two types of dielectric layers having different materials are used for the first dielectric layer 1041 and the second dielectric layer 1042.

Specific examples of the material preferably used for the first dielectric layer 1041 include organic dielectric materials such as BCB (benzocyclobutene, available from Dow Chemical Co., Ltd., $\varepsilon_{r1}$=2), polytetrafluoroethylene, or polyimide. Here, $\varepsilon_{r1}$ is the relative dielectric constant of the first dielectric layer 1041. Further, an inorganic dielectric material such as a TEOS oxide film or spin-on glass, which can form a relatively thick film and has a low dielectric constant, may be used for the first dielectric layer 1041.

Further, the second dielectric layer 1042 is required to have an insulating property (a property of acting as an insulator and high-resistance resistor that does not conduct electricity as a DC voltage is applied), a barrier property (a property of preventing a metal material used for an electrode from diffusing), and a processability (a property of being processed with submicron accuracy). Specific examples of the material preferably used for satisfying such properties include inorganic insulator materials such as silicon oxide ($\varepsilon_{r2}$=4), silicon nitride ($\varepsilon_{r2}$=7), aluminum oxide, or aluminum nitride. Here, $\varepsilon_{r2}$ is the relative dielectric constant of the second dielectric layer 1042.

Here, in the case where the dielectric layer 104 has a two-layer structure as in the present embodiment, the relative dielectric constant $\varepsilon_r$ of the dielectric layer 104 is an effective relative dielectric constant determined from the thickness and the relative dielectric constant $\varepsilon_{r1}$ of the first dielectric layer 1041 and the thickness and the relative dielectric constant $\varepsilon_{r2}$ of the second dielectric layer 1042. Further, from the viewpoint of impedance matching between antenna and space, it is preferable that the difference in dielectric constant between antenna and air is small. Thus, the first dielectric layer 1041 is made of a material different from that of the second dielectric layer 1042, and the material preferably has a relative dielectric constant lower than that of the second dielectric layer 1042 ($\varepsilon_{r1}<\varepsilon_{r2}$). Note that, in the semiconductor element 100, the dielectric layer 104 does not have to have a two-layer structure, and may have a structure composed of only one layer made of the above-mentioned materials.

The semiconductor layer 115a is disposed on the first conductor layer 106 formed on the substrate 113. The semiconductor layer 115a and the first conductor layer 106 are electrically connected to each other. Note that, in order to reduce the ohmic loss, it is preferable that the semiconductor layer 115a and the first conductor layer 106 are connected with low resistance. An electrode 116a is disposed on the side opposite to the side where the first conductor layer 106 is disposed with respect to the semiconductor layer 115a, and the electrode 116a and the semiconductor layer 115a are electrically connected to each other. The semiconductor layer 115a and the electrode 116a are embedded in the second dielectric layer 1042 and are surrounded by the second dielectric layer 1042.

If the electrode 116a is a conductor that makes ohmic contact with the semiconductor layer 115a, it is suitable for reducing the ohmic loss and RC delay due to the series resistance. For the electrode 116a being used as an ohmic electrode, examples of the material preferably used include Ti/Pd/Au, Ti/Pt/Au, AuGe/Ni/Au, TiW, Mo, ErAs, and the like. Further, if the region of the semiconductor layer 115a in contact with the electrode 116a is a semiconductor doped with high concentration of impurities, the contact resistance becomes lower, which is suitable for high output and high frequency. Since the absolute value of the negative resistance indicating the magnitude of the gain of the RTD 101a used in the terahertz wave band is on the order of about 1 to 100Ω, it is preferable to suppress the loss of the electromagnetic wave to 1% or less. Thus, the contact resistance of the ohmic electrode is preferably designed to have 1Ω or less as a guide. Further, in order to operate in the terahertz wave band, the width of the semiconductor layer 115a (almost equal to the electrode 116a) is typically about 0.1 to 5 μm. Accordingly, it is preferable to set the resistivity of the contact interface between the semiconductor layer 115a and the electrode 116a to 10Ω·m² or less to suppress the contact resistance to the range of 0.001 to several Ω.

Further, it is conceivable to use a metal that makes Schottky contact with the electrode 116a, instead of ohmic contact. In this case, the contact interface between the electrode 116a and the semiconductor layer 115a exhibits rectification, and the antenna 100a has a suitable structure as a terahertz wave detector. Hereinafter, in the present embodiment, a configuration using an ohmic electrode as the electrode 116a will be described.

Inside the antenna 100a arranged above and below the RTD 101a, as illustrated in FIG. 1B, the substrate 113, the first conductor layer 106, the semiconductor layer 115a, the electrode 116a, a conductor 117a, and the second conductor layer 103a are stacked in this order.

The conductor 117a is formed inside the dielectric layer 104. The second conductor layer 103a and the electrode 116a are electrically connected to each other via the conductor 117a. Here, if the width of the conductor 117a is too large, the radiation efficiency is reduced due to the deterioration of the resonance characteristic of the patch antenna 100a and the increase of the parasitic capacitance. Thus, the width of the conductor 117a preferably has a dimension such that it does not interfere with the resonant electric field, and is typically ⅒ or less of the effective wavelength λ of the terahertz wave having the oscillation frequency of $f_{THz}$ standing in the antenna 100a. Further, the width of the conductor 117a may be reduced to the extent that it does not increase the series resistance, and as a guide, it can be reduced to about twice the skin depth. Considering that the series resistance is reduced to the extent that it does not exceed 1Ω, the width of the conductor 117a is typically in the range of at least 0.1 μm and not more than 20 μm as a guide.

The second conductor layer 103a is electrically connected to a line 108a1 and a line 108a2 via a conductor 107a1 and a conductor 107a2. Further, the lines 108a1 and 108a2 are lead wires electrically connected to a bias circuit 120 via a bias line 111 which is a common wire formed in the chip. The lines 108 are each drawn from an antenna. The bias circuit 120 is a power source for supplying a bias signal to the RTD 101a of the antenna 100a. Accordingly, the bias signal is supplied to the semiconductor layer 115 of each antenna by the connection between the bias line 111 and the lines 108 which are lead wires drawn from the adjacent antennas. Since the bias line 111 is common, the variation in operating voltage between the antennas can be reduced, so that synchronization is stabilized even for an increased number of antennas in the array. In addition, the structure around each antenna can be made symmetrical, resulting in no deformation of the radiation pattern.

The conductors 107a1 and 107a2 are connection portions for electrically and mechanically connecting the lines 108a1 and 108a2 to the second conductor layer 103a. A structure that electrically connects the upper and lower layers, such as the conductor 117a, the conductor 107a1, or the conductor 107a2, is called a via. The first conductor layer 106 and the second conductor layer 103a not only serve as members constituting the patch antenna, but also serve as electrodes for injecting a current into the RTD 101a by being connected to the vias for them. For the conductor 117a and the conductors 107a1 and 107a2 which are vias, a material having a resistivity of $1×10^{-6}$ Ω·m or less is preferably used. Specifically, examples of the material preferably used include metals, such as Ag, Au, Cu, W, Ni, Cr, Ti, Al, AuIn alloy, and TiN, and their compounds.

The width of each of the conductors 107a1 and 107a2 is smaller than the width of the second conductor layer 103a. The width as referred to herein is a width in the electromagnetic wave resonance direction (=A-A' direction) in the antenna 100a. Further, the width of a part (connection part) of the line 108a1 (line 108a2) connected to the conductor 107a1 (conductor 107a2) is smaller (narrower) than the width of the second conductor layer 103a (antenna 100a). Further, these widths are each preferably ⅒ or less (λ/10 or less) of the effective wavelength λ of the terahertz wave having the oscillation frequency $f_{THz}$ standing in the antenna 100a. This is because it is preferable to arrange the conductors 107a1 and 107a2 and the lines 108a1 and 108a2 in dimensions and positions such that they do not interfere with the resonance electric field in the antenna 100a in order to improve the radiation efficiency.

Further, it is preferable that the positions of the conductors 107a1 and 107a2 are arranged in the electric field nodes of the terahertz wave having the oscillation frequency $f_{THz}$ standing in the antenna 100a. In this case, the conductors 107a1 and 107a2 and the lines 108a1 and 108a2 have a configuration in which the impedance is sufficiently higher than the absolute value of the differential negative resistance of the RTD 101a in a frequency band around the oscillation frequency $f_{THz}$. In other words, the lines 108a1 and 108a2 are connected to antennas other than the antenna 100a so as to have high impedance for the RTD at the oscillation frequency $f_{THz}$. In this case, the other antennas and the antenna 100a are isolated (separated) in a path via the bias line 111 at the frequency $f_{THz}$. As a result, a current with the oscillation frequency $f_{THz}$ induced in each antenna via the bias line 111 and the bias circuit 120 does not affect the adjacent antenna. Further, the interference between the electric field having the oscillation frequency $f_{THz}$ standing in the antenna 100a and these feeding members is suppressed. The same applies to the other antennas 100b to 100i in the semiconductor element 100 as well as the antenna 100a.

The bias line 111 is a common bias wire (wiring layer) for the antennas 100a to 100i. The each of antennas 100a to 100i is connected to the bias line 111 via one of the lines 108 connected to the one of the antennas 100a to 100i. In FIGS. 1B and 1C, the bias line 111 is illustrated in which wires in the A-A' direction (resonance direction) are labeled with 111x1 to 111x4, and wires in the B-B' direction are labeled with 111y1 to 111y4. Note that, in this description, the entire bias common wire for the semiconductor element 100 is referred to as the bias line 111.

((Bias Circuit)): The bias circuit 120 is a power supply disposed outside the chip in order to supply a bias signal to the RTDs 101a to 101i. The bias circuit 120 includes a shunt resistor 121 which is connected in parallel with each of the RTDs 101a to 101i, a wire 122, a power supply 123, and a capacitor 124 (a capacitor connected in parallel with the shunt resistor 121).

The wire 122 is illustrated as an inductance in FIG. 1A because it always has a parasitic inductance component. The power supply 123 supplies a current required to drive each of the RTDs 101a to 101i, and adjusts a bias voltage applied to each of the RTDs 101a to 101i. The bias voltage is typically selected from voltages in the differential negative resistance region of the RTD used for the RTDs 101a to 101i. The bias circuit 120 is connected to the bias line 111, which is an in-chip wire. For the antenna 100a, the bias voltage from the bias circuit 120 is supplied to the RTD 101a in the antenna 100a via the line 108a1 and the line 108a2. The same applies to the other antennas 100b to 100i as well as the antenna 100a.

The shunt resistor 121 and the capacitor 124 have a role of suppressing parasitic oscillation with a resonance frequency of relatively low frequency (typically, a frequency band from DC (direct current) to 10 GHz) caused by the bias circuit 120. The shunt resistor 121 is selected to have a value equal to or slightly smaller than the absolute value of the combined differential negative resistance of the RTDs 101a to 101i which are connected in parallel. Similar to the shunt resistor 121, the capacitor 124 is also set to have a value such that the impedance of the element is equal to or slightly lower than the absolute value of the combined differential negative resistance of the RTDs 101a to 101i which are connected in parallel. In other words, the bias circuit 120 is set by such a shunt structure to have an impedance lower than the absolute value of a combined negative resistance corresponding to the gain in a frequency band from DC to 10 GHz. Generally, the capacitor 124 preferably has a larger capacitance as long as it is within the above-mentioned range, and in the example of the present embodiment, a capacitance of about several tens of pF. The capacitor 124 is a decoupling capacitor, and for example, may make use of a MIM (Metal-insulator-Metal) structure in which the antenna 100a and the substrate are integrated.

(Antenna Array): The semiconductor element 100 is an antenna array including the nine antennas 100a, 100b, 100c, 100d, 100e, 100f, 100g, 100h, and 100i, which are arranged in a 3×3 matrix. Each of the antennas 100a to 100i alone produces an oscillating terahertz wave at a frequency of $f_{THz}$. The adjacent antennas are mutually coupled by a coupling line 109, so that they are in mutual injection locking (mutual synchronization) with the oscillation frequency $f_{THz}$ of the terahertz wave.

Here, the mutual injection locking means that a plurality of self-excited oscillators oscillate in entrainment synchronization by their interaction. For example, the antenna 100a and the antenna 100b are mutually coupled by a coupling line 109ab, and the antenna 100a and the antenna 100d are mutually coupled by a coupling line 109ad. The same applies to the other adjacent antennas. Note that "mutually coupled" refers to a phenomenon in which a current induced in one antenna acts on another adjacent antenna to change the transmission and reception characteristics of each other. By synchronizing the mutually coupled antennas in the same phase or the opposite phase, the mutual injection locking phenomenon causes the electromagnetic fields to be strengthened or weakened between the antennas. This makes it possible to adjust the increase and decrease of the antenna gain. Note that, in this description, when the entire coupling line connecting the antennas of the semiconductor element 100 is represented, it is referred to as the coupling line 109. Further, each coupling line connecting the antennas included in the coupling line 109 is referred to using the alphabets for the corresponding antennas. For example, the coupling line connecting the antenna 100a and the antenna 100b is referred to as the coupling line 109ab.

The oscillation conditions of the semiconductor element 100 are determined by the conditions of mutual injection locking in a configuration in which two or more individual RTD oscillators are coupled, which is disclosed in J. Appl. Phys., Vol. 103, 124514 (2008) (NPL 2). Specifically, now consider the oscillation conditions of the antenna array in which the antenna 100a and the antenna 100b are coupled by the coupling line 109ab. In this case, two oscillation modes are possible: a positive phase mutual injection locking and a negative phase mutual injection locking. The oscillation conditions for the oscillation mode (even mode) of the positive phase mutual injection locking are represented by Equations 4 and 5, and the oscillation conditions for the oscillation mode (odd mode) of the negative phase mutual injection locking are represented by Equations 6 and 7.

Positive phase (even mode): frequency $f=f_{even}$ $Y_{even}=Yaa+Yab+Y_{RTD}$ $Re(Y_{even}) \leq 0$ (Equation 4)

$Im(Y_{even})=0$ (Equation 5)

Negative phase (odd mode): frequency $f=f_{odd}$ $Y_{odd}=Yaa+Yab+Y_{RTD}$ (Equation 5)

$Re(Y_{odd}) \leq 0$ (Equation 6)

$Im(Y_{odd})=0$ (Equation 7)

Here, $Y_{ab}$ is a mutual admittance between the antenna 100a and the antenna 100b. $Y_{ab}$ is proportional to a coupling constant representing the strength of the coupling between the antennas, and ideally, the real part of $-Y_{ab}$ is large and the imaginary part is zero. The semiconductor element 100 of the present embodiment is coupled under the condition for the positive phase mutual injection locking, and the oscillation frequency $f_{THz}$ is almost equal to $f_{even}$. Similarly, for the other antennas, the adjacent antennas are mutually coupled by the coupling line 109 so that the above-mentioned conditions for the positive phase mutual injection locking are satisfied.

The coupling line 109 is a microstrip line in which the dielectric layer 104 is interposed between the third conductor layer 110 and the first conductor layer 106. For example, as illustrated in FIG. 1B, the coupling line 109ab has a structure in which the dielectric layer 104 is interposed between the third conductor layer 110ab and the first conductor layer 106. Similarly, the dielectric layer 104 is interposed between the first conductor layer 106, and the third conductor layer 110bc in the coupling line 109bc; the third conductor layer 110ad in the coupling line 109ad; and the third conductor layer 110cf in the coupling line 109cf.

In the semiconductor element 100, the adjacent antennas are coupled by DC coupling. The third conductor layer 110ab, which is the upper conductor layer of the coupling line 109ab for coupling the antenna 100a and the antenna 100b, is directly connected to the second conductor layers 103a and 103b. In the semiconductor element 100, the third conductor layer 110ab and the second conductor layers 103a and 103b are formed in the same layer. Similarly, the third conductor layer 110ad, which is the upper conductor layer of the coupling line 109ad for coupling the antenna 100a and the antenna 100d, is directly connected to the second conductor layers 103a and 103d. The third conductor layer 110ad and the second conductor layers 103a and 103d are formed in the same layer.

With this structure, the antenna 100b and the antenna 100d are mutually coupled for the antenna 100a, and operate in mutual synchronization with the frequency $f_{THz}$ of the oscillating terahertz wave. In the antenna array synchronized by such DC coupling, the adjacent antennas can be synchronized by a strong coupling, so that it is possible to facilitate entrainment synchronization operation, which is robust to variations in frequency and phase of the antennas.

Note that, in the semiconductor element 100, the coupling line 109 and the bias line 111 are arranged in different layers. For example, as illustrated in FIG. 1B, the third conductor layer 110ab forming the coupling line 109ab for coupling the antenna 100a and the antenna 100b and the fourth conductor layer 111x2 forming the bias line 111 are arranged in different layers. Further, the third conductor layer 110ad forming the coupling line 109ad for coupling the antenna 100a and the antenna 100d and the fourth conductor layer 111x1 forming the bias line 111 are arranged in different layers. In other words, the wiring layers in which parts of the coupling line 109 extending in the in-plane direction (direction perpendicular to the stacking direction) of the substrate 113 are formed and the wiring layer in which a part of the bias line 111 extending in the in-plane direction of the substrate 113 is formed are arranged in different layers. Here, the wiring layers in which the parts of the coupling line 109 extending in the in-plane direction are formed are the third conductor layer 110 and the first conductor layer 106. On the other hand, the wiring layer in which the part of the bias line 111 extending in the in-plane direction is formed is the fourth conductor layer 111. Further, when a virtual plane which is the plane in which the first conductor layer 106 extends is taken, the distance between the coupling line 109 and the virtual plane is different from the distance between the bias line 111 and the virtual plane. Note that, in the present embodiment, all the third conductor layers 110 and the first conductor layer 106 in all the antennas are arranged in a layer different from any of the fourth conductor layers 111. Here, the wire constituting the bias line 111 has a part larger than the width of the wire constituting the coupling line 109. The larger part is located, for example, between a plurality of antennas.

In this way, the coupling line 109 that transmits a high frequency ($f_{THz}$) and the bias line 111 that transmits a low frequency (DC to several tens of GHz) are arranged in different layers. This makes it possible to freely set the layout such as the width, length, and routing of the transmission line in each layer.

Further, in the semiconductor element 100, the substrate 113, the first conductor layer 106, and the second conductor layer 103a are stacked in this order from the substrate 113 side. Also, at least one of the coupling line 109 and the bias line 111 is disposed in a layer between the first conductor layer 106 and the second conductor layer 103. For example, as illustrated in FIG. 1B, the fourth conductor layers 111x2 and 111x1 are arranged in a layer between the first conductor layer 106 and the second conductor layer 103.

Further, as illustrated in FIG. 2, when viewed from above (in plan view), the coupling line 109 and the bias line 111 cross each other. For example, as illustrated in FIGS. 1B and 1C, in plan view, the third conductor layer 110ab and the fourth conductor layer 111x2 cross each other, and the third conductor layer 110ad and the fourth conductor layer 111y3 cross each other.

In this way, by drawing lines so that the coupling line 109 and the bias line 111 cross each other, a more layout-saving configuration can be realized. Therefore, with such a configuration, the number of antennas to be arranged can be increased even in an antenna array in which antennas are arranged in a matrix of m×n (m≥2, n≥2). According to the present embodiment, even if the number of antennas is increased, it is possible to suppress the physical interference between the coupling line (coupling line 109) for synchronizing the antennas and the feeding line (bias line 111) for supplying a bias to each RTD 101. Therefore, in the semiconductor element 100, the restriction of the upper limit of the number of antennas to be arranged can be relaxed, and it can be expected that an increased number of antennas in the array have a great effect of improving the directivity and the front strength.

Further, by disposing at least one of the coupling line 109 and the bias line 111 in a layer between two conductor layers forming the antenna, a layout-saving configuration can be realized. Specifically, the coupling line 109 and/or the bias line 111 are embedded in a free area other than the antennas in the dielectric layer 104 forming the antennas 100a to 100i. As a result, a plurality of transmission lines can be arranged in a relatively small space between adjacent antennas arranged at a pitch of about a wavelength, so that it is possible to sufficiently cope with an increased number of lines due to an increase in the number of antennas.

Figure 3:
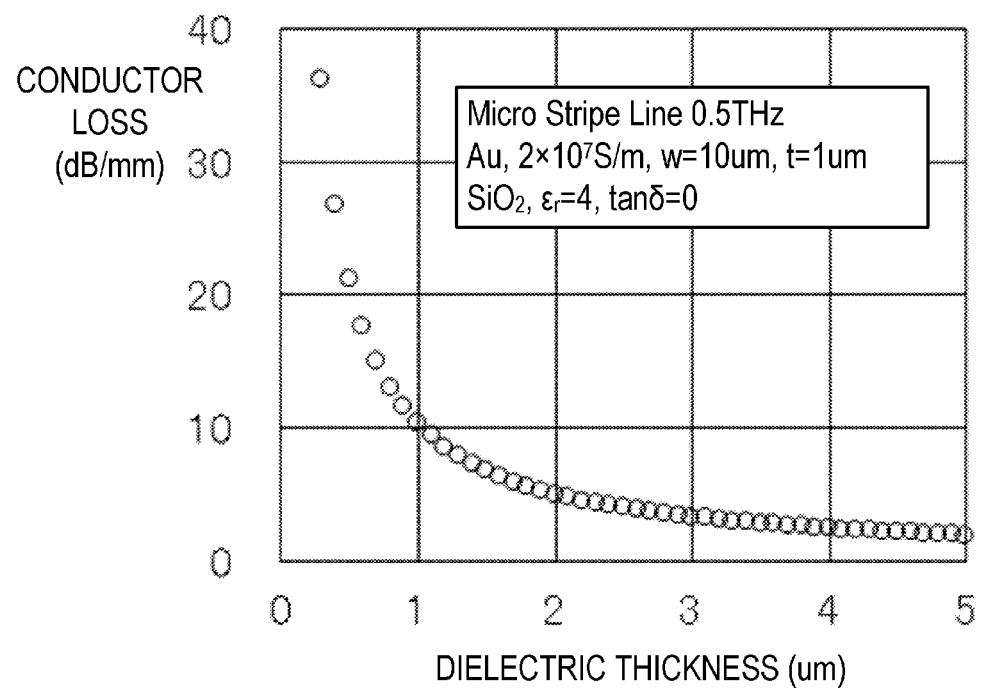
FIG. 3 is a graph of the relationship between dielectric layer thickness and conductor loss.

Note that, in the terahertz band, the resistance due to the skin effect increases, so that the conductor loss associated with high-frequency transmission between antennas is not negligible. FIG. 3 illustrates a result of analysis of the correlation between a dielectric layer thickness of a microstrip line having a configuration similar to that of the present embodiment and the conductor loss at 0.5 THz. The microstrip lines used in the analysis has a structure in which a dielectric ($SiO_2$, $\varepsilon_r=4$, tan δ=0) is interposed between an upper conductor layer (material Au, 1 μm thickness, conductivity $2\times10^7$ S/m) with a line width of 10 μm and a grounding conductor (material Au, 1 μm thickness, conductivity $2\times10^7$ S/m). For the analysis of the conductor loss, HFSS was used which is a solver for high-frequency electromagnetic fields that uses a finite element method, commercially available from ANSYS, Inc.

As the current density between conductor layers increases, the conductor loss (dB/mm) per unit length increases. Further, as illustrated in FIG. 3, for the microstrip line, the conductor loss (dB/mm) per unit length is inversely proportional to the square of the dielectric thickness. Therefore, in order to increase the radiation efficiency of the antenna array, it is preferable to thicken not only the antenna but also the dielectric forming the coupling line 109 to reduce the conductor loss. By contrast, the semiconductor element 100 according to the present embodiment has a configuration in which the bias line 111 is provided on the first conductor layer 106 side in the first dielectric layer 1041, and the third conductor layer 110 in which a high frequency wave with the frequency $f_{THz}$ is transmitted is provided as an upper layer of the dielectric layer 104. With this configuration, it is possible to suppress a decrease in the radiation efficiency of the antenna array due to the conductor loss in the terahertz band. With this configuration for the antenna 100a, the substrate 113, the first conductor layer 106, the fourth conductor layers 111x1 and 111x2, the second conductor layer 103a, and the third conductor layers 110ad and 110ab are stacked in this order from the substrate 113 side. The same applies to the relationship between the coupling line 109 for coupling the other antennas and the bias line 111.

As described above, the semiconductor element 100 according to the present embodiment has a configuration with high radiation efficiency. Note that, from the viewpoint of the conductor loss illustrated in FIG. 3, the thickness of the dielectric forming the coupling line 109 is preferably 1 μm or more. and more preferably, a dielectric thickness set to 2 μm or more makes it possible to reduce losses due to the conductor loss in the terahertz band to about 20%. Similarly, from the viewpoint of the conductor loss, it is preferable that the distance in the thickness direction between the third conductor layer 110 and the first conductor layer 106, which form the coupling line 109 is long. Further, it is preferable that the distance in the thickness direction between the third conductor layer 110 forming the coupling line 109 and the fourth conductor layer 111 forming the bias line 111 is long. The bias line 111 can function as a low impedance line for up to the gigahertz band when the dielectric is set to 2 μm or less, preferably 1 μm or less. Further, even when the dielectric is set to have a thickness of 2 μm or more, it can function as a low impedance line as long as it has a configuration in which a shunt component is connected to the bias line as in the semiconductor element 100.

Further, in the semiconductor element 100 according to the present embodiment, feeding is performed for the adjacent antennas by the common bias line 111 disposed between the antennas. For example, as illustrated in FIG. 1C, the antenna 100a is connected to the bias line 111y3 via the conductor 107a2 and the line 108a2, and the antenna 100d is connected to the bias line 111y3 via a conductor 107d1 and a line 108d1. Similarly, the antenna 100a and the antenna 100b are adjacent to each other, so that a bias signal is fed to them by the connection to the common bias line 111x2 disposed between the two antennas. The same applies to the bias lines 111 for the other antennas 100b to 100i. In this way, the common use of the bias line 111, which is a wire in the chip, among the antennas makes it possible to drive the antennas in the same channel, resulting in a simplified drive method. Further, the number of wires can be reduced and each wire can be made thicker, so that it is possible to prevent the wiring resistance from increasing due to an increased number of antennas in the array and accordingly, prevent the operating point from shifting among the antennas. As a result, it is possible to prevent the frequency and phase from shifting among the antennas due to an increased number of antennas in the array, resulting in more easily obtaining the synchronization effect of the arrays.

Note that the common use of the bias line 111 is not an essential structure. For example, for each antenna, a plurality of bias lines 111 may be prepared by being multilayered or miniaturized for their separate feeding. In this case, the isolation between the antennas via the bias line 111 is enhanced, so that the risk of low-frequency parasitic oscillation can be reduced. Further, in the semiconductor element 100, the lines 108 and the bias line 111 preferably have a lower impedance than the negative resistance of the RTDs 101a to 101i in a low frequency band lower than the oscillation frequency $f_{THz}$. More preferably, the impedance is equal to or slightly smaller than the absolute value of the combined differential negative resistances of the RTDs 101a to 101i which are connected in parallel. This makes it possible to suppress low-frequency multimode oscillation.

As described above, according to the present embodiment, it is possible to reduce the loss of electromagnetic waves as compared with the conventional case, and to produce an oscillating terahertz wave or detect a terahertz wave with higher efficiency.

(First Example): A specific configuration of the semiconductor element 100 that produces an oscillating terahertz wave, according to the first embodiment, will be described with reference to FIGS. 1A to 1C as a first example. The semiconductor element 100 is a semiconductor device capable of single-mode oscillation in a frequency band of 0.45 to 0.50 THz. The RTDs 101a to 101i have a multiple quantum well structure in which InGaAs/AlAs is lattice-matched on the InP substrate 113, and in the present example, an RTD having a double barrier structure is used as each. The semiconductor layer heterostructure of the RTD is the structure disclosed in J Infrared Milli Terahz Waves (2014) 35: 425-431 (NPL 3).

The current-voltage characteristics of the RTDs 101a to 101i are measured values of a peak current density of 9 mA/μm$^2$ and a differential negative conductance per unit area of 10 mS/μm$^2$. In the antenna 100a, a mesa structure is formed which is composed of the semiconductor layer 115a which includes the RTD 101a and the electrode 116a which is an ohmic electrode. The mesa structure is circular with a diameter of 2 μm in the present example. At this time, the magnitude of the differential negative resistance of the RTD 101a is about −30Ω per diode. In this case, the differential negative conductance ($G_{RTD}$) of the semiconductor layer 115a including the RTD 101a is estimated to be about 30 mS, and the diode capacitance ($C_{RTD}$) of the RTD 101a is estimated to be about 10 fF.

The antenna 100a is a patch antenna having a structure in which the dielectric layer 104 is interposed between the second conductor layer 103a, which is a patch conductor, and the first conductor layer 106, which is a grounding conductor. The semiconductor layer 115a including the RTD 101a is integrated inside the antenna 100a. The antenna 100a is a square patch antenna having a side of the second conductor layer 103a of 150 μm, and the resonator length (L) of the antenna is 150 μm.

A metal layer mainly composed of an Au thin film having a low resistivity is used for the second conductor layer 103a, which is a patch conductor, and the first conductor layer 106, which is a grounding conductor. The second conductor layer 103a is made of a metal containing Ti/Au (=5/300 nm). The dielectric layer 104 is a layer disposed between the second conductor layer 103a and the first conductor layer 106. The dielectric layer 104 is composed of two layers: the first dielectric layer 1041 made of BCB (benzocyclobutene, available from Dow Chemical Co., Ltd., $\varepsilon_{r1}$=2) with a thickness of 5 μm and the second dielectric layer 1042 made of SiO$_2$ (plasma CVD, $\varepsilon_{r2}$=4) with a thickness of 2 μm.

The first conductor layer 106 is composed of a Ti/Pd/Au layer (20/20/200 nm) and a semiconductor layer composed of an n$^+$-InGaAs layer (100 nm) having an electron concentration of 1×10$^{18}$ cm$^{-3}$ or more, and the metal and the semiconductor layer are connected by low resistance ohmic contact.

The electrode 116a is an ohmic electrode composed of a Ti/Pd/Au layer (20/20/200 nm). The electrode 116a is connected to a semiconductor layer formed on the semiconductor layer 115a and composed of an n$^+$-InGaAs layer (100 nm) having an electron concentration of 1×10$^{18}$ cm$^{-3}$ or more by low resistance ohmic contact.

Around the RTD 101a, the substrate 113, the first conductor layer 106, the semiconductor layer 115a, the electrode 116a, the conductor 117a composed of a conductor containing Cu, and the second conductor layer 103a are stacked in this order from the substrate 113 side, and are electrically connected. The RTD 101a is disposed at a position shifted by 40% (60 μm) of one side of the second conductor layer 103a in the resonance direction (AA' direction) from the center of gravity of the second conductor layer 103a. Here, the input impedance when a high frequency wave is fed from the RTD to the patch antenna is determined depending on the position of the RTD 101a in the antenna 100a. The second conductor layer 103a is connected to the lines 108a1 and 108a2 arranged in the lower layer via the conductors 107a1 and 107a2 which are vias made of Cu.

The lines 108a1 and 108a2 are formed of a metal layer containing Ti/Au (=5/300 nm) stacked on the second dielectric layer 1042. The lines 108a1 and 108a2 are connected to the bias circuit 120 via the bias line 111 which is a common wire formed in the chip. The bias line 111 is formed of a metal layer containing Ti/Au (=5/300 nm) stacked on the second dielectric layer 1042. The antenna 100a is designed to set a bias in the negative resistance region of the RTD 101a so that oscillation at a power of 0.2 mW can be obtained at a frequency of $f_{THz}$=0.5 THz.

The conductors 107a1 and 107a2 have a cylindrical structure with a diameter of 10 μm. The lines 108a1 and 108a2 are composed of a pattern formed of a metal layer containing Ti/Au (=5/300 nm) having a width of 10 μm in the resonance direction (=A-A' direction) and a length of 75 μm. The conductors 107a1 and 107a2 are connected to the second conductor layer 103a at the center in the resonance direction (=A-A' direction) and at the ends in the B B' direction. These connection positions correspond to the nodes of the electric field of the $f_{THz}$ terahertz wave standing in the antenna 100a.

The semiconductor element 100 is an antenna array in which the nine antennas 100a to 100i are arranged in a 3×3 matrix. Each antenna is designed to produce an oscillating terahertz wave at the frequency of $f_{THz}$ alone, and is disposed at a pitch (interval) of 340 μm in both the A-A' direction and the B-B' direction. The adjacent antennas are mutually coupled by the coupling line 109 including the third conductor layer 110 made of Ti/Au (=5/300 nm). For example, the antenna 100a and the antenna 100b are mutually coupled by the coupling line 109ab. The second conductor layer 103a and the second conductor layer 103b are directly connected by the third conductor layer 110ab, having a width of 5 μm and a length of 190 μm, which is formed in the same layer. Further, the antenna 100a and the antenna 100d are mutually coupled by the coupling line 109ad. The second conductor layer 103a and the second conductor layer 103d are directly connected by the third conductor layer 110ad, having a width of 5 μm and a length of 440 μm, which is formed in the same layer. The same applies to other antennas. The antennas 100a to 100i are in mutual injection locking in a state of being in phase with each other (positive phase) at the oscillation frequency of $f_{THz}$=0.5 THz to produce oscillating waves.

The bias line 111, which is a common wire formed in the chip, is a bias wire common among the antennas, and is connected to the lines 108 connected to the antennas 100a to 100i.

In the semiconductor element 100, the coupling line 109 and the bias line 111 are arranged in different layers, as with the relationship between the third conductor layer 110ab of the coupling line 109ab and the fourth conductor layer 111x1 of the bias line 111. Further, in the semiconductor element 100, the substrate 113, the first conductor layer 106, and the second conductor layer 103a are stacked in this order from the substrate 113 side. Further, the bias line 111 is disposed in a layer between the first conductor layer 106 and the second conductor layer 103, as with the fourth conductor layer 111x1. Further, the coupling line 109 and the bias line 111 cross each other. The same applies to the relationship between the coupling line 109 for coupling the other antennas 100b to 100i and the bias line 111. With such a configuration, it is possible to reduce the physical interference between the coupling line (coupling line 109) for synchronizing the antennas and the feeding line (bias line 111) for supplying a bias to each RTD 101. Therefore, the number of antennas to be arranged is increased, so that it can be expected that an increased number of antennas in the array have a great effect of improving the directivity and the front strength.

(Method for Manufacturing Semiconductor Element): Next, a method for manufacturing (method for producing) the semiconductor element 100 according to the present example will be described.

(1) First, an InGaAs/AlAs-based semiconductor multilayer film structure that forms the semiconductor layers 115a to 115i including the RTD 101a to 101i is formed by epitaxial growth on the substrate 113 made of InP. It is formed by a molecular beam epitaxy (MBE) method, a metalorganic vapor phase epitaxy (MOVPE) method, or the like.

(2) A Ti/Pd/Au layer (20/20/200 nm) that forms the ohmic electrodes 116a to 116i is formed on the semiconductor layers 115a to 115i by a sputtering method.

(3) The electrodes 116a to 116i and the semiconductor layers 115a to 115i are formed into a circular mesa shape having a diameter of 2 μm to form a mesa structure. Here, photolithography and ICP (inductively coupled plasma) dry etching are used to form the mesa shape.

(4) After the first conductor layer 106 is formed on the substrate 113 by a lift-off method on the etched surface, a silicon oxide film having a thickness of 2 μm to be the second dielectric layer 1042 is formed by a plasma CVD method.

(5) A Ti/Au layer (=5/300 nm) is formed on the second dielectric layer 1042 as the fourth conductor layer 111 forming the lines 108a1 to i2 and the bias line 111. This completes the formation of the bias line 111.

(6) A BCB film with a thickness of 5 μm to be the first dielectric layer 1041 is embedded and flattened using a spin coating method and a dry etching method.

(7) Parts of the BCB and silicon oxide films which form the conductors 117a to 117i and the conductors 107a1 to 107i2 to be vias are removed by photolithography and dry etching to form via holes (contact holes). Also, using photolithography including grayscale exposure for this formation makes it possible to optionally control the taper angle of the via holes for forming the first dielectric layer 1041 and the second dielectric layer 1042 and the coupling line 109.

(8) The conductors 117a to 117i and conductors 107a1 to 107i2, which are vias, are formed by conductors containing Cu in the via holes. For the formation of the conductors 117a to 117i and the conductors 107a1 to 107i2, via hole embedding and flattening with Cu are carried out by using a sputtering method, an electroplating method, and a chemical mechanical polishing method.

(9) Electrode Ti/Au layer films (=5/300 nm) to be the second conductor layers 103a to 103i of the antennas and the third conductor layer 110 forming the coupling line 109 are formed by a sputtering method.

(10) By photolithography and ICP (inductively coupled plasma) dry etching, the second conductor layers 103a to 103i and the third conductor layer 110 forming the coupling line 109 are patterned. This step completes the formation of the coupling line 109.

(11) Finally, the shunt resistor 121 and the MIM capacitor 124 are formed, and they are connected to the wire 122 and the power supply 123 by wire bonding or the like to complete the semiconductor element 100.

Note that the power supply to the semiconductor element 100 is performed by the bias circuit 120, and normally, when a bias voltage resulting in a differential negative resistance region is applied to supply a bias current, the semiconductor element 100 operates as an oscillator.

Figure 4A:
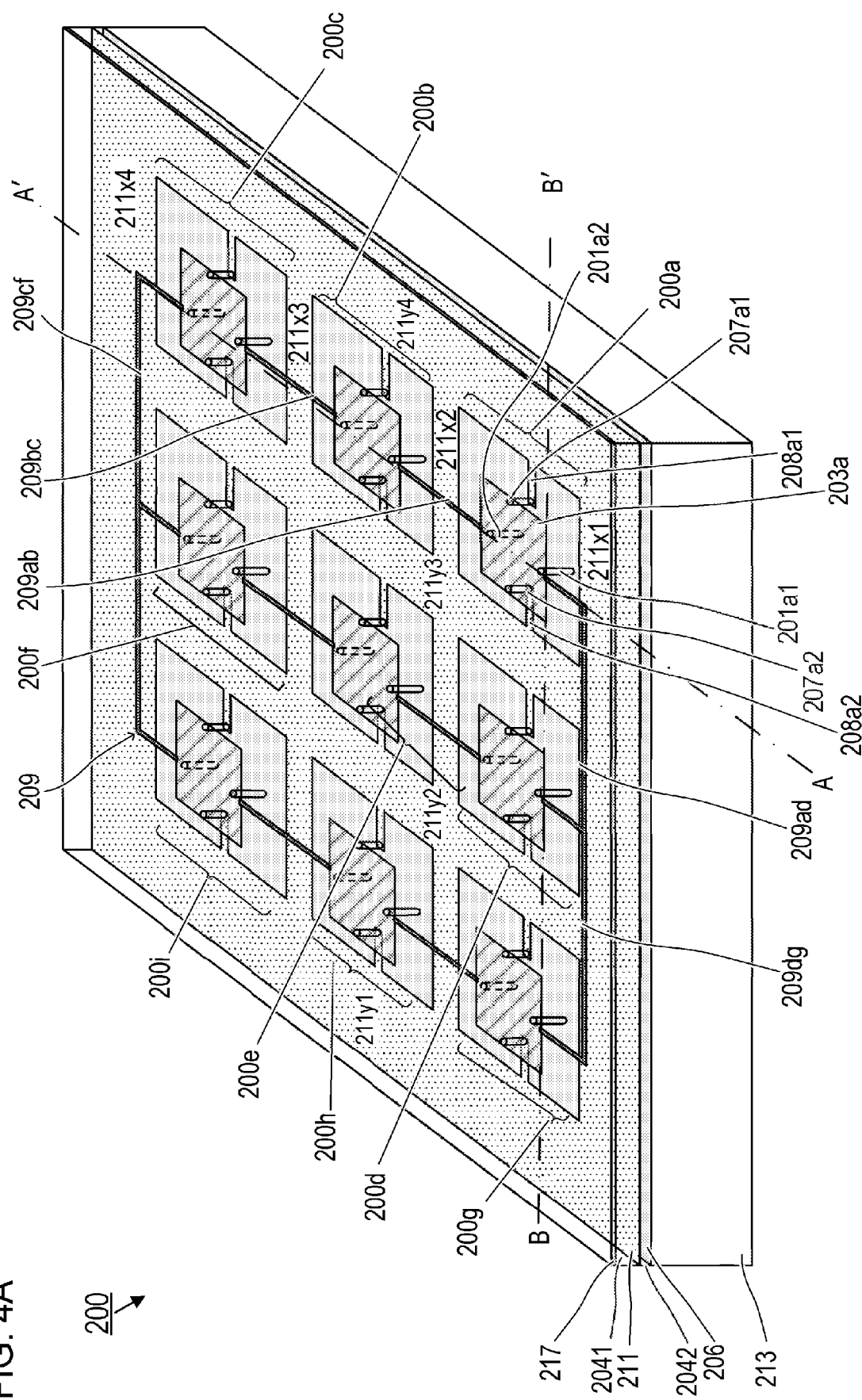
FIG. 4A is a diagram illustrating a semiconductor element according to a second embodiment.
Figure 4B:
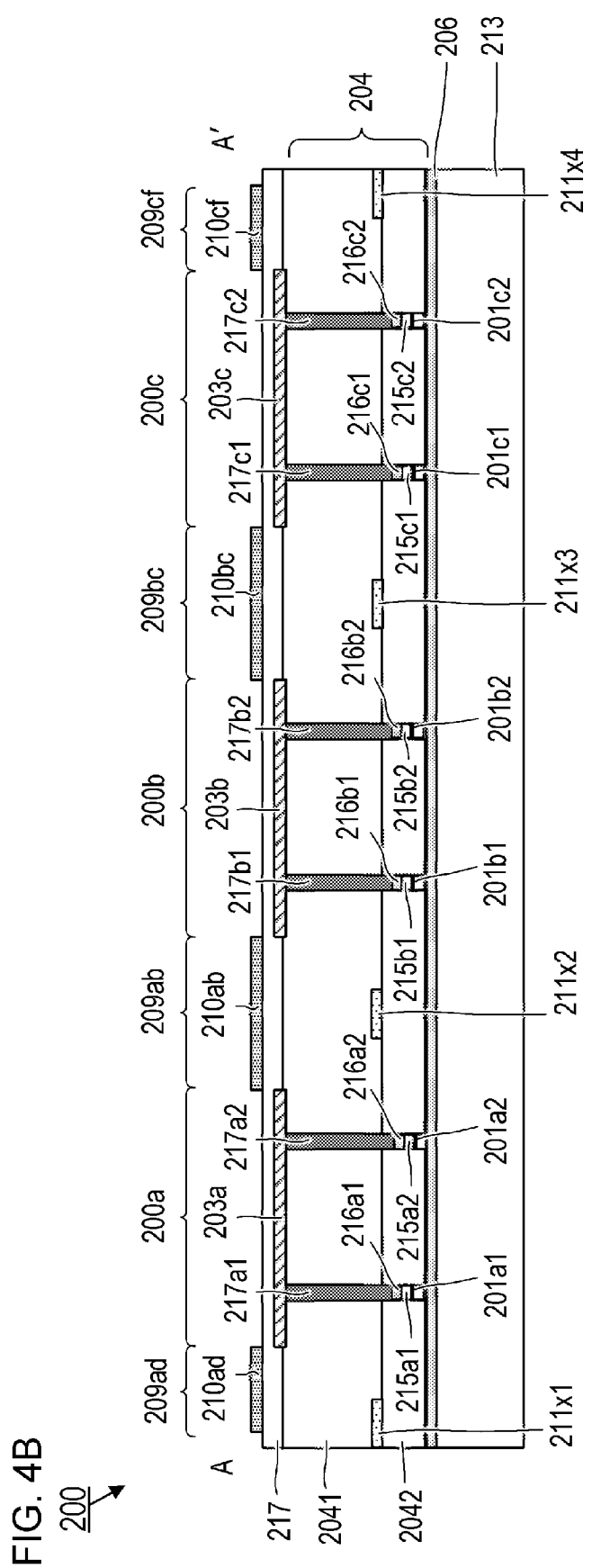
FIG. 4B is a diagram illustrating the semiconductor element according to the second embodiment.
Figure 4C:
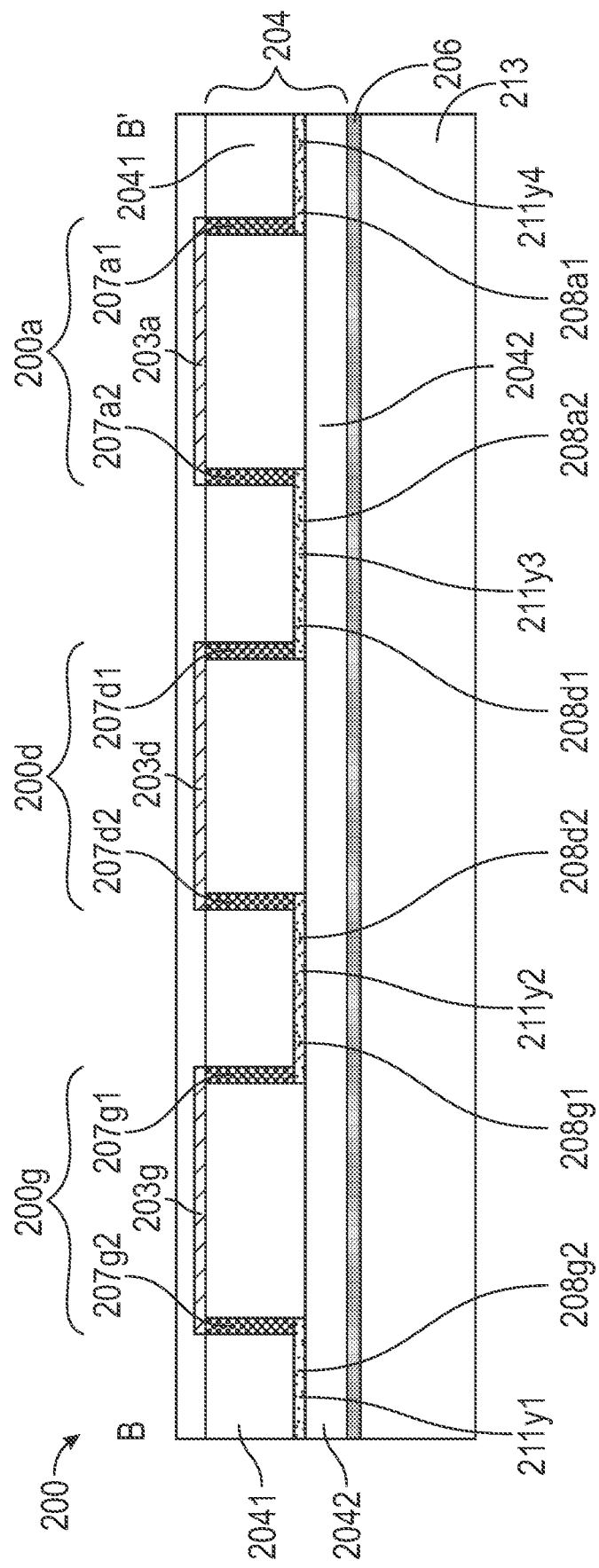
FIG. 4C is a diagram illustrating the semiconductor element according to the second embodiment.

<Second Embodiment> FIGS. 4A, 4B, and 4C illustrate a semiconductor element 200 according to a second embodiment. Note that the configurations and structures of the semiconductor element 200 other than the following have the same components having the same name of the semiconductor element 100 according to the first embodiment, and detailed description thereof will be omitted accordingly. Further, also in the present embodiment, a coupling line 209 and a bias line 211 are arranged in different layers as in the first embodiment.

The semiconductor element 200 is an antenna array in which nine antennas 200a to 200i are arranged in a 3×3 matrix. Unlike the first embodiment, the antenna 200a includes two active layers having an electromagnetic wave gain or non-linearity for a terahertz wave in one antenna. Specifically, the antenna 200a includes a semiconductor layer 215a1 including an RTD 201a1 and a semiconductor layer 215a2 including an RTD 201a2.

An electrode 216a1 and an electrode 216a2 are arranged on the side opposite to the side where a first conductor layer 206 is disposed with respect to the semiconductor layer 215a1 and the semiconductor layer 215a2. The electrode 216a1 and the semiconductor layer 215a1 are electrically connected, and the electrode 216a2 and the semiconductor layer 215a2 are electrically connected. Further, a bias signal is fed from the bias circuit 120 to the two RTDs 201a1 and 201a2 via the conductor layers 217a1 and 217a2, which are vias connected between a second conductor layer 203a and the electrodes 216a1 and 216a2.

The RTD 201a1 is disposed at a position shifted by 40% of the length of one side of the second conductor layer 203a in the resonance direction (i.e., AA' direction) from the center of gravity of the second conductor layer 203a. On the other hand, the RTD 201a2 is disposed at a position shifted by −40% of the length of one side of the second conductor layer 203a in the resonance direction (i.e., AA' direction) from the center of gravity of the second conductor layer 203a. In other words, the RTD 201a1 and the RTD 201a2 are arranged at positions that pass through the center of gravity of the second conductor layer 203a and are line-symmetrical with respect to a straight line (center line) perpendicular to the resonance direction and the stacking direction. With this configuration, the RTD 201a1 and RTD 201a2 are in mutual injection locking in a state of being in phase inverted with each other (negative phase) to produces oscillating waves. In this way, the vertically and horizontally symmetrical configuration of the RTDs in the antenna is a configuration in which an increased number of antennas in the array easily have an effect of improving the directivity and the front strength.

The coupling line 209 is composed of a microstrip line in which a dielectric layer 204 and a dielectric layer 217 are interposed between the fourth conductor layer 210 stacked on the dielectric layer 217 stacked on the dielectric layer 204 and the first conductor layer 206. For example, as illustrated in FIG. 4B, a coupling line 209ab has a structure in which the dielectric layer 204 and the dielectric layer 217 are interposed between a fourth conductor layer 210ab and the first conductor layer 206.

Similarly, a coupling line 209bc has a structure in which the dielectric layer 204 and the dielectric layer 217 are interposed between a fourth conductor layer 210bc serving as an upper conductor layer and the first conductor layer 206, and a coupling line 209ad has a structure in which the dielectric layer 204 and the dielectric layer 217 are interposed between a fourth conductor layer 210ad serving as an upper conductor layer and the first conductor layer 206.

The semiconductor element 200 is an antenna array having a configuration in which antennas are coupled by AC coupling (capacitive coupling). For example, the fourth conductor layer 210ab, which is the upper conductor layer in the coupling line 209ab for coupling the antenna 200a and the antenna 200b, overlaps the second conductor layers 203a and 203b by 5 μm near the radiation end in plan view. The same applies to the coupling between the adjacent antennas of the other antennas 200b to 200i.

In the part where the conductor layers overlap, the second conductor layers 203a and 203b, the dielectric layer 217, and the fourth conductor layer 210ab are stacked in this order to form a metal-insulator-metal (MIM) capacitor structure. With this structure, the relationship between the second conductor layer 203a and the second conductor layer 203b is open for DC, and their coupling degree is small in a low frequency range below $f_{THz}$, so that isolation between the elements is ensured. On the other hand, in the band of the oscillation frequency $f_{THz}$, the degree of the coupling between the antennas can be adjusted by the capacitance. Such a structure makes it possible to significantly weaken the coupling between the antennas, which also leads to the suppression of transmission loss between the antennas, and as a result, it can be expected to improve the radiation efficiency of the antenna array.

Figure 5A:
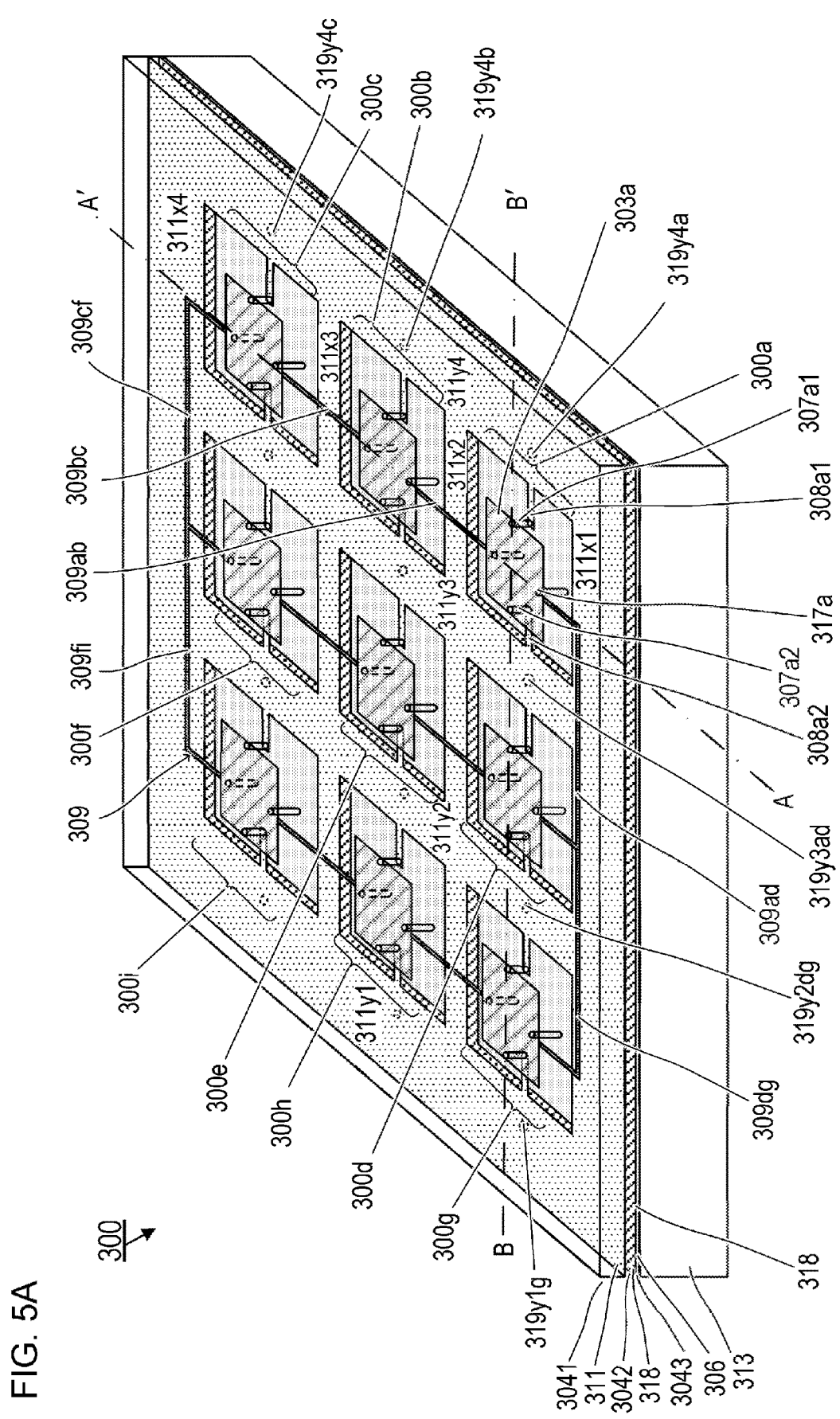
FIG. 5A is a diagram illustrating a semiconductor element according to a third embodiment.
Figure 5B:
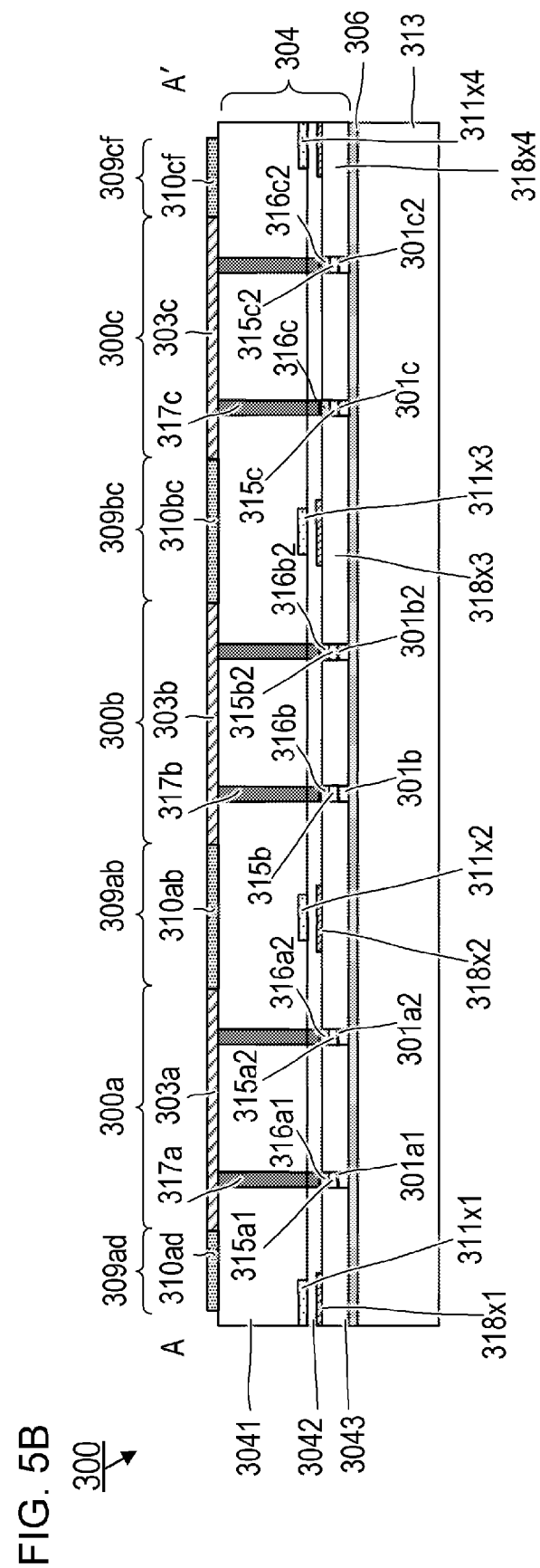
FIG. 5B is a diagram illustrating the semiconductor element according to the third embodiment.
Figure 5C:
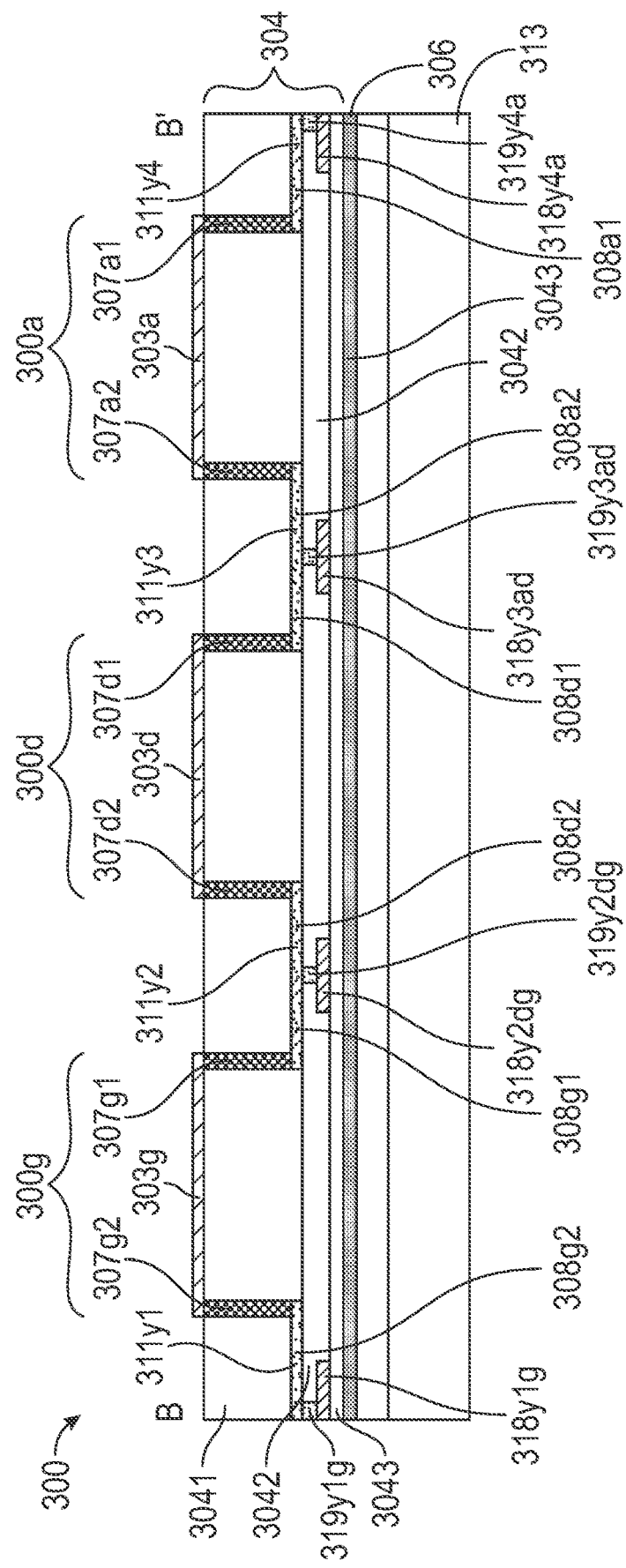
FIG. 5C is a diagram illustrating the semiconductor element according to the third embodiment.

<Third Embodiment>: FIGS. 5A, 5B, and 5C illustrate a semiconductor element 300 according to a third embodiment. Note that the configurations and structures of the semiconductor element 300 other than the following have the same components having the same name of the semiconductor element 200 according to the second embodiment, and detailed description thereof will be omitted accordingly. Further, also in the present embodiment, a coupling line 309 and a bias line 311 are arranged in different layers as in the first embodiment.

The semiconductor element 300 is an antenna array in which nine antennas 300a to 300i are arranged in a 3×3 matrix. As with the semiconductor element 200 according to the second embodiment, each of the antennas 300a to 300i includes two active layers having an electromagnetic wave gain or non-linearity for a terahertz wave in one antenna. Further, unlike the semiconductor element 200 according to the second embodiment, in the semiconductor element 300, the bias line 311 has a shunt structure in order to suppress parasitic oscillation in a frequency band lower than the oscillation frequency $f_{THz}$. The shunt structure is a structure that is arranged in parallel with an RTD, which is a negative resistance element, to short a frequency band lower than $f_{THz}$ so that parasitic oscillation can be suppressed. Further, the shunt structure is a structure in which a resistance element or elements in which a resistor and a capacitor are connected in series are arranged in parallel with an RTD. In the shunt structure, the resistor and capacitor have a value such that the impedance of the elements is equal to or slightly lower than the absolute value of the combined differential negative resistance of a plurality of RTDs arranged in the vicinity of the elements.

The semiconductor element 300 includes, as a dielectric layer 304, three dielectric layers: a first dielectric layer 3041, a second dielectric layer 3042, and a third dielectric layer 3043. Note that, for the third dielectric layer 3043 to be used as a dielectric for the capacitor of the shunt structure, silicon nitride ($\varepsilon_{r2}=7$) having a relatively high dielectric constant is used to miniaturize the MIM capacitor structure. Here, for the dielectric layer 304 having the three-layer structure, the effective relative dielectric constant is determined in consideration of the thickness and the relative dielectric constant of the third dielectric layer 3043.

Further, a fifth conductor layer 318 is stacked on the third dielectric layer 3043. Accordingly, from a substrate 313 side, a metal-insulator-metal (MIM) capacitor structure is formed in which a first conductor layer 306, the third dielectric layer 3043, and the fifth conductor layer 318 are stacked in this order, and this capacitor structure is disposed under the bias line 311. The fifth conductor layer 318 is disposed in a layer between the first conductor layer 306 and both a third conductor layer 310 and the fourth conductor layer 311.

Here, each of the antennas 300a to 300i has a resistor and a capacitor as the shunt structure. For example, for the antenna 300a, a resistive element 319y4a connected to a bias line 311y4 corresponds to the resistor. The MIM capacitor structure in which the third dielectric layer 3043 is interposed between a fifth conductor layer 318y4a connected to the resistive element 319y4a and the first conductor layer 306 corresponds to the capacitor. As described above, in the present embodiment, the first conductor layer 306 and the bias line 311 are electrically connected via the capacitor and the resistor. Note that, depending on the arrangement of the bias line 311 and the third conductor layer 310, the first conductor layer 306 and the third conductor layer 310 may be electrically connected via a resistor.

Further, a fifth conductor layer 318y3ad is connected to a resistive element 319y3ad connected to the bias line 311y3. The third dielectric layer 3043 is interposed between the fifth conductor layer 318y3ad and the first conductor layer 306, which is the MIM capacitor structure. Note that the configuration in which the shunt structure is disposed in a node of the high frequency electric field having the oscillation frequency $f_{THz}$ standing in the antennas 300a to 300i has high impedance at the frequency $f_{THz}$, and thus it is more suitable for selectively producing only a high frequency oscillating wave at the frequency $f_{THz}$.

However, there is a risk that unexpected low-frequency multimode oscillation will occur due to an increased number of antennas in the array and the common use of the bias line in the antenna array. Therefore, the semiconductor element 300 has a configuration in which lines 308a1 and 308a2 to lines 308i1 and 308i2 and the bias line 311 are set to have a lower impedance than the negative resistance element (semiconductor layer 315) in a low frequency band lower than the oscillation frequency $f_{THz}$. With this structure, even for an increased number of antennas in the antenna array, it is possible to suppress other mode oscillation and obtain stable single frequency oscillation in the terahertz band.

<Fourth Embodiment>: FIGS. 6A to 6C, FIG. 7, and FIGS. 8A to 8C illustrate a semiconductor element 400 and a semiconductor element 500, according to a fourth embodiment. The semiconductor elements 400 and 500 are each an antenna array in which nine antennas are arranged in a 3×3 matrix. Here, coupling lines 409 and 509 are each disposed in a lower layer, and bias lines 411 and 511 are each disposed in an upper layer. The coupling line needs to be phase-matched between the antennas in the terahertz band, and thus the shape may be complicated depending on the antenna configuration. On the other hand, the bias line for bias feeding can be a relatively simple pattern. Therefore, the configuration in which the bias line is disposed in the upper layer and the coupling line is disposed in the lower layer as in the present embodiment is a configuration in which the interference between the metal body other than the antenna and the emitted electromagnetic wave is reduced.

Figure 6A:
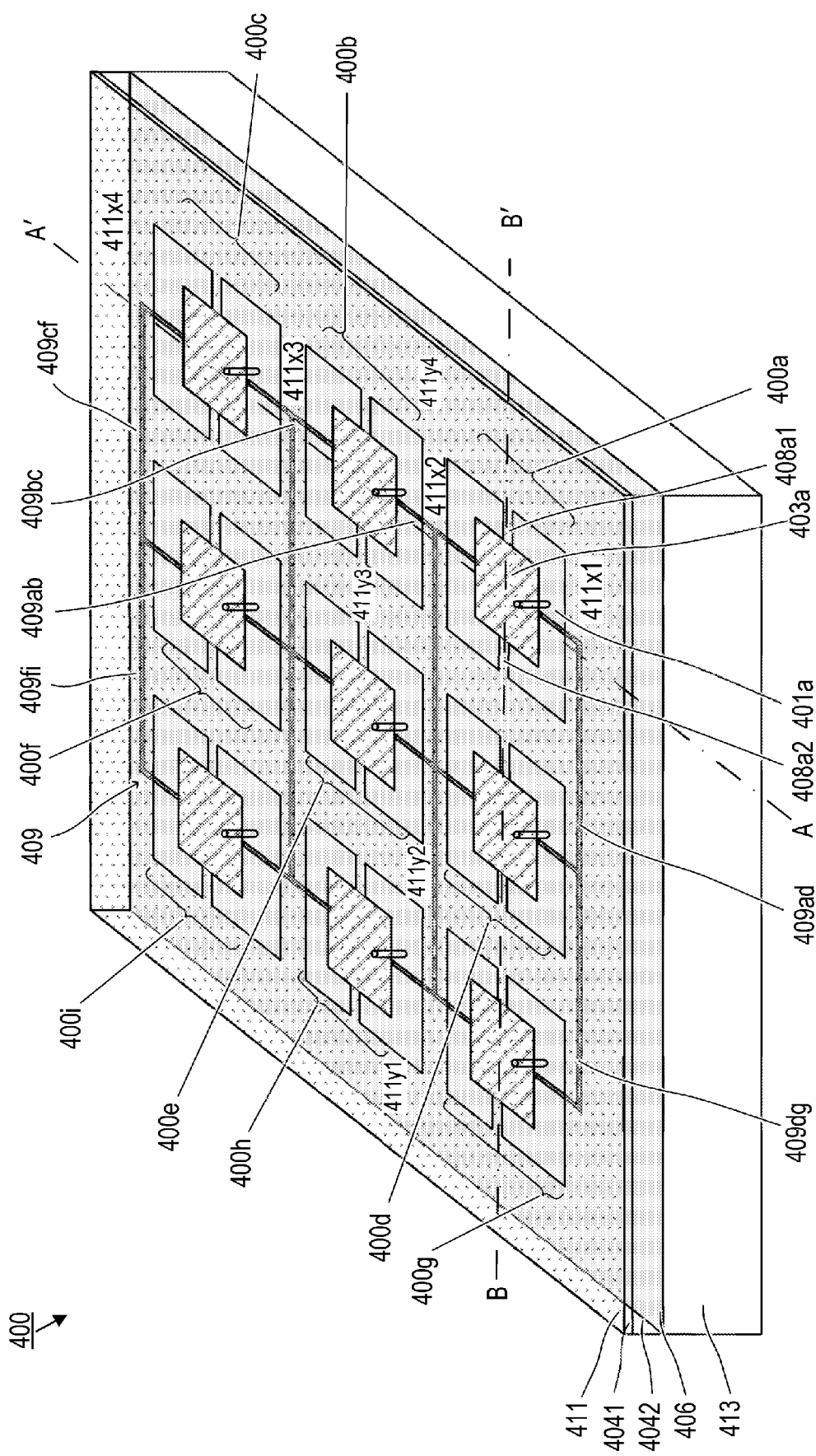
FIG. 6A is a diagram illustrating a semiconductor element according to a fourth embodiment.
Figure 6B:
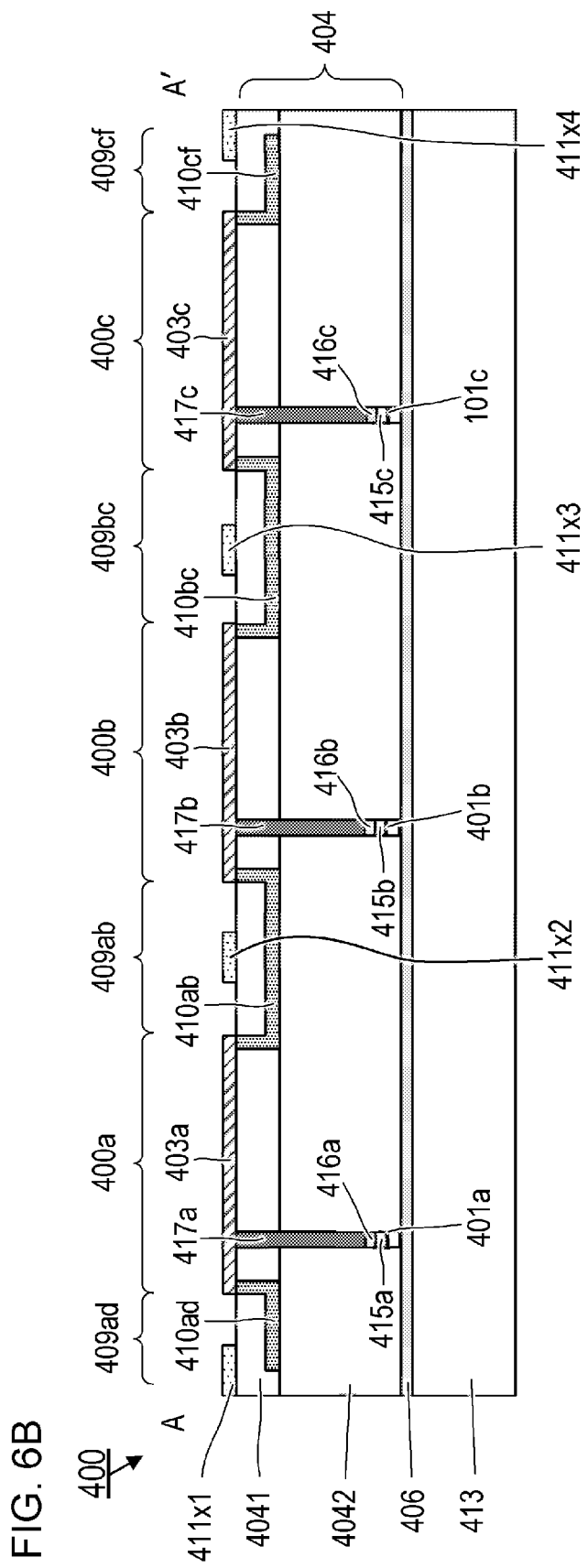
FIG. 6B is a diagram illustrating the semiconductor element according to the fourth embodiment.
Figure 6C:
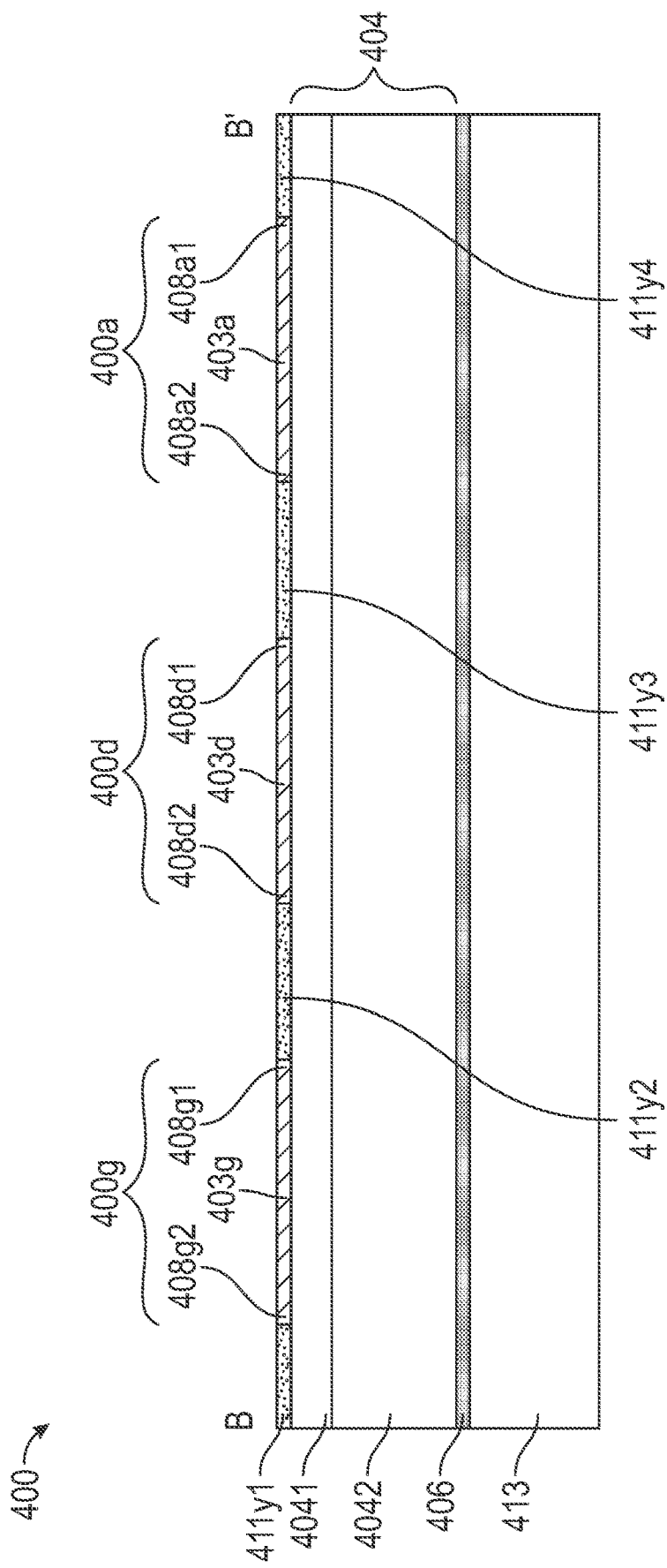
FIG. 6C is a diagram illustrating the semiconductor element according to the fourth embodiment.

The semiconductor element 400 illustrated in FIGS. 6A to 6C includes nine antennas of antennas 400a to 400i. As illustrated in FIG. 6B, a third conductor layer 410ab is disposed below a fourth conductor layer 411x2 that is stacked on a first dielectric layer 4041 and that forms the bias line 411. Note that the third conductor layer 410ab is stacked on the first dielectric layer 4041 forming the coupling line 409ab associated with the antenna 400a. The same applies to the other antennas 400b to 400i as well as the antenna 400a.

Accordingly, in the semiconductor element 400, a substrate 413, a first conductor layer 406 which is a grounding conductor for the antenna, the third conductor layer 410ab, a second conductor layer 403a which is a patch conductor, and the fourth conductor layer 411x2 are stacked in this order from the substrate 413 side. The adjacent antennas of the semiconductor element 400 are coupled by DC coupling. For example, the third conductor layer 410ab, which is the upper conductor layer of the coupling line 409ab for coupling the antenna 400a and the antenna 400b, is directly connected to the second conductor layers 403a and 403b. The same applies to the coupling between the other antennas. Here, in the semiconductor element 400, the third conductor layer 410ab is formed in the lower layer of the second conductor layers 403a and 403b so as to be covered with the first dielectric layer 4041. Note that, in the present embodiment, the second conductor layer 403 and the fourth conductor layer 411 are arranged in the same layer, but their arrangement is not limited to this, and the fourth conductor layer 411 may be formed in a lower layer of the second conductor layer 403.

Figure 7:
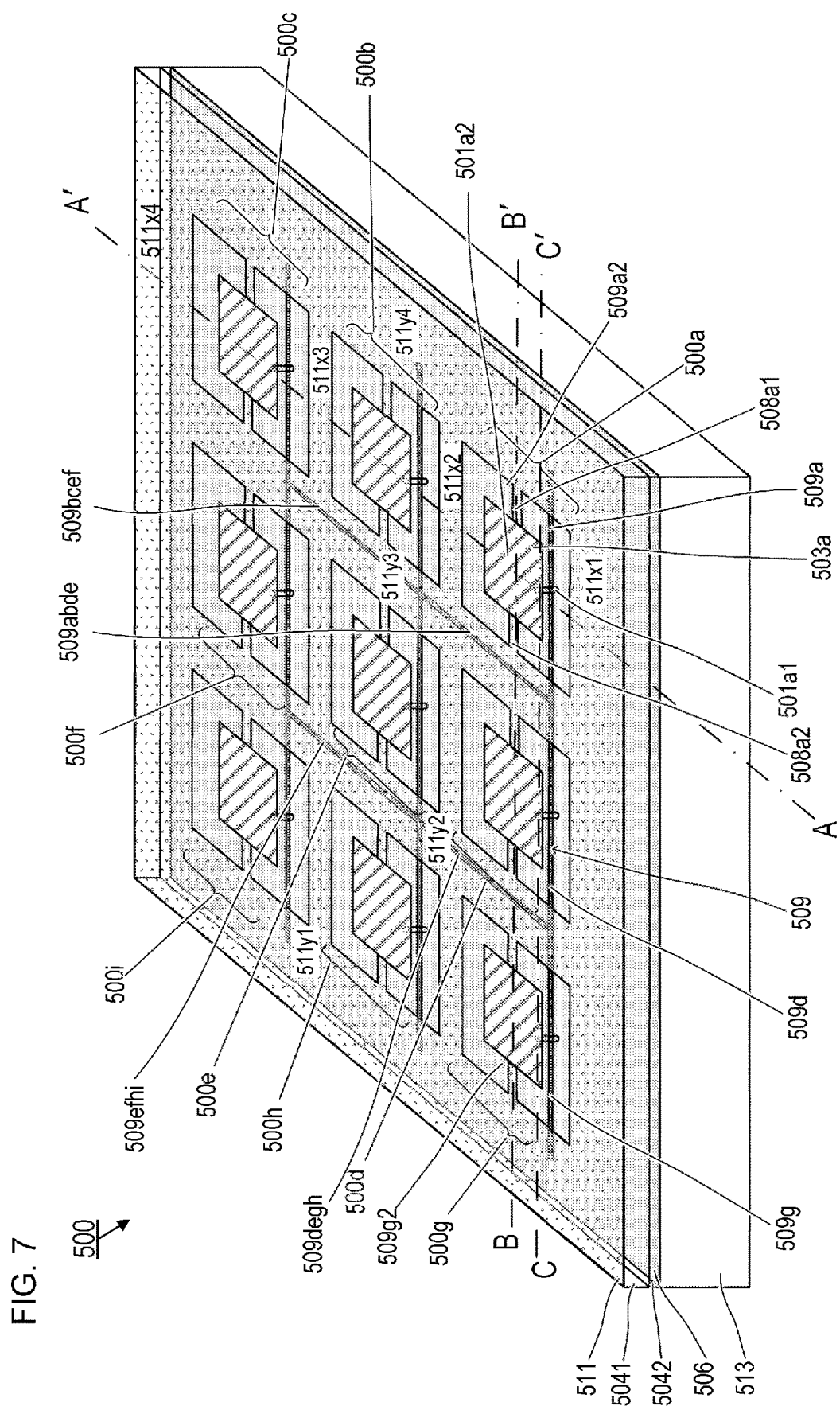
FIG. 7 is a diagram illustrating the semiconductor element according to the fourth embodiment.
Figure 8A:
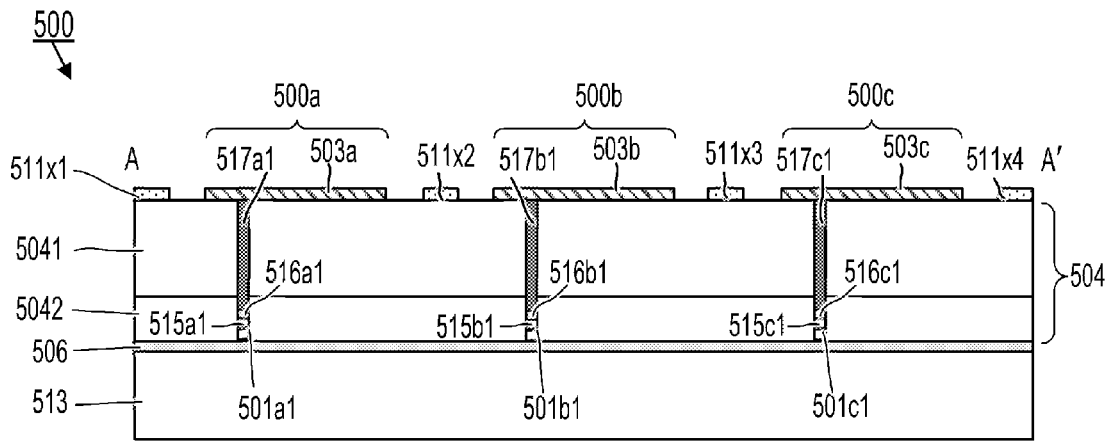
FIGS. 8A to 8C are diagrams illustrating the semiconductor element according to the fourth embodiment.
Figure 8B:
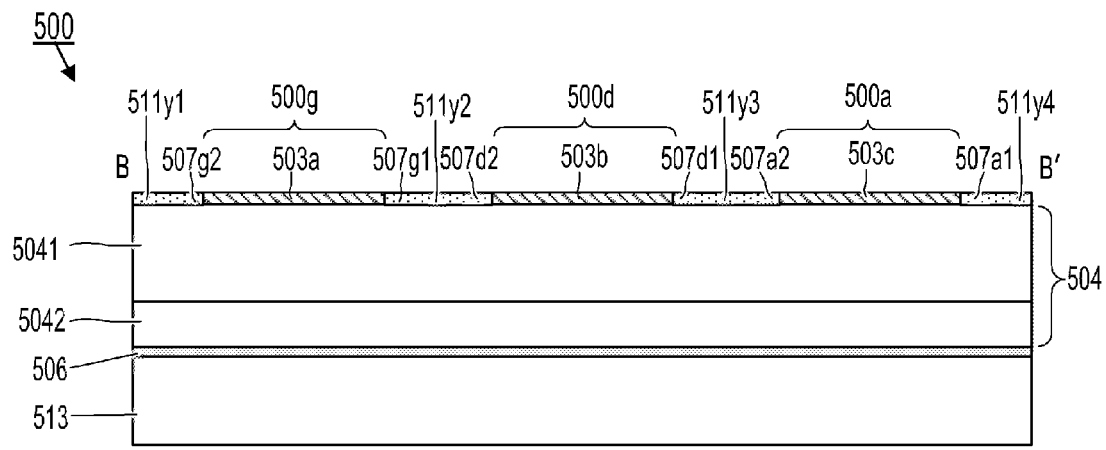
Figure 8C:
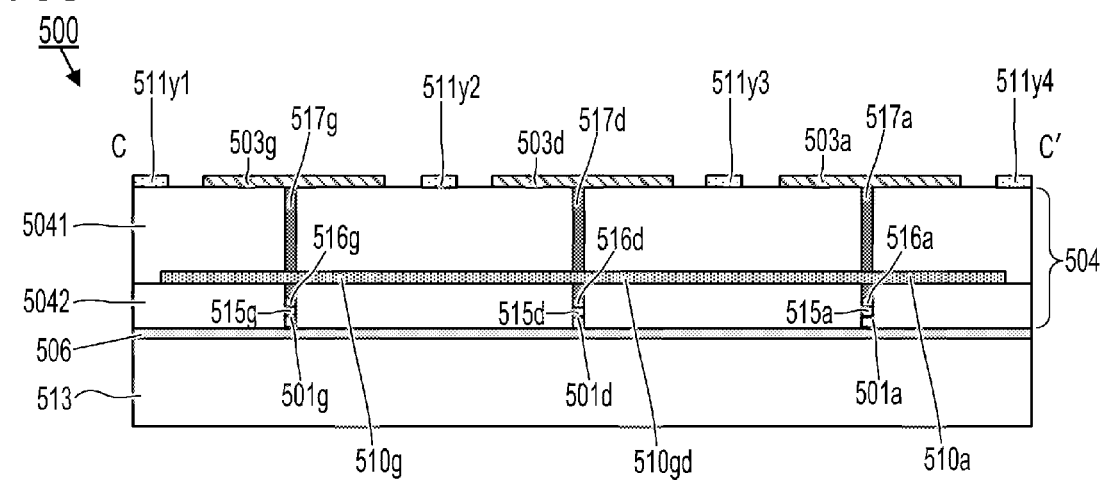

The semiconductor element 500 illustrated in FIGS. 7 to 8C includes nine antennas of antennas 500a to 500i. The semiconductor element 500 is an antenna array in which the adjacent antennas are connected by a coupling line 509 which is a microstrip line including a third conductor layer 510 serving as an upper conductor layer. Note that the third conductor layer 510 is disposed between a first conductor layer 506, which is a grounding conductor, and second conductor layers 503a to 503i, which are patch conductors.

In the antenna 500a, a composite resonator including a patch antenna and a coupling line 509a is integrated in an RTD 501a, and the patch antenna is composed of the first conductor layer 506 and the second conductor layer 503a, and the coupling line 509a is composed of the first conductor layer 506 and a third conductor layer 510a.

The coupling line 509a has a structure in which a second dielectric layer 5042 is interposed between the first conductor layer 506 and the third conductor layer 510a, and the longitudinal direction of the coupling line 509a is a direction (i.e., CC' direction) perpendicular to the resonance direction (i.e., AA' direction). The third conductor layer 510a is connected to a via 517a connecting the second conductor layer 503a and the RTD 501a. As a result, the RTD 501a is coupled to the two resonators: the patch antenna defined by the second conductor layer 503a and the coupling line 509a defined by the third conductor layer 510a. Accordingly, the length of the coupling line 509a and the size of the patch antenna are important parameters for determining the frequency of an electromagnetic wave to oscillate. The oscillation frequency $f_{THz}$ of the antenna 500a can be determined by the length of the second conductor layer 503a in the AA' direction and the length of the third conductor layer 510a in the CC' direction. Specifically, the length of the third conductor layer 510a in the CC' direction may be set to an integral multiple of the effective length of the desired oscillation wavelength, and the length of the second conductor layer 503a in the AA' direction may be set to ½ of the effective length of the desired oscillation wavelength. Here, the bias line 511 is composed of a fourth conductor layer 511y3 stacked on a first dielectric layer 5041, and the third conductor layer 510a is disposed below the fourth conductor layer 511y3. The same applies to the components of the other antennas 500b to 500i. Note that, in the present embodiment, the second conductor layer 503 and the fourth conductor layer 511 are arranged in the same layer, but their arrangement is not limited to this, and the fourth conductor layer 511 may be formed in a lower layer of the second conductor layer 503.

The adjacent antennas are connected by the coupling line 509 by DC coupling. For example, for the coupling of the antenna 500a and the antenna 500b, they are directly connected to each other by the end of the third conductor layers 510a and 510b which are the upper conductor layers of the coupling lines 509a and 509b. Further, for the coupling between the antenna 500a and the antenna 500d, they are directly connected to each other at the end of the third conductor layers 510a and 510d which are the upper conductor layers of the coupling lines 509a and 509d. Note that it is preferable to locate the RTDs 501a to 501i at the maximum points of the electric field of the electromagnetic wave (oscillation frequency $f_{THz}$) standing in the coupling line 509 in order to enhance the entrainment synchronization between the antennas. The same applies to the coupling between the other antennas.

As described above, the third conductor layer 510 of the coupling line 509 is in a layer different from the second conductor layer 503 forming the patch antenna, thereby increasing the degree of freedom of device design for performing phase synchronization in the array.

Figure 9A:
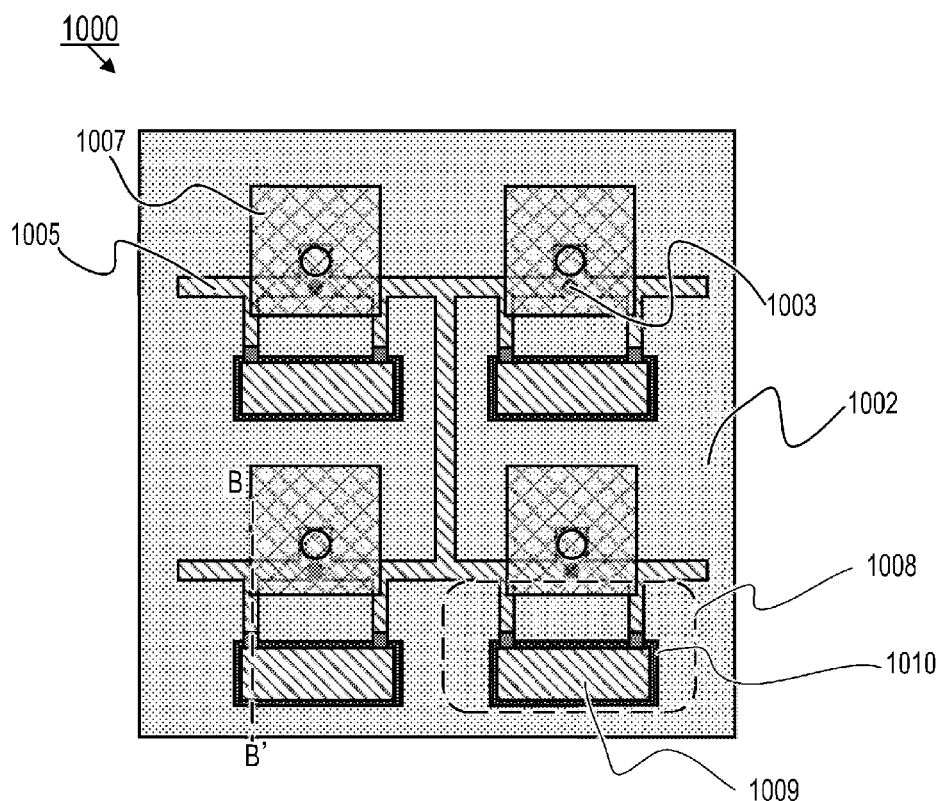
FIGS. 9A and 9B are diagrams illustrating an oscillating element according to a fifth embodiment.
Figure 9B:
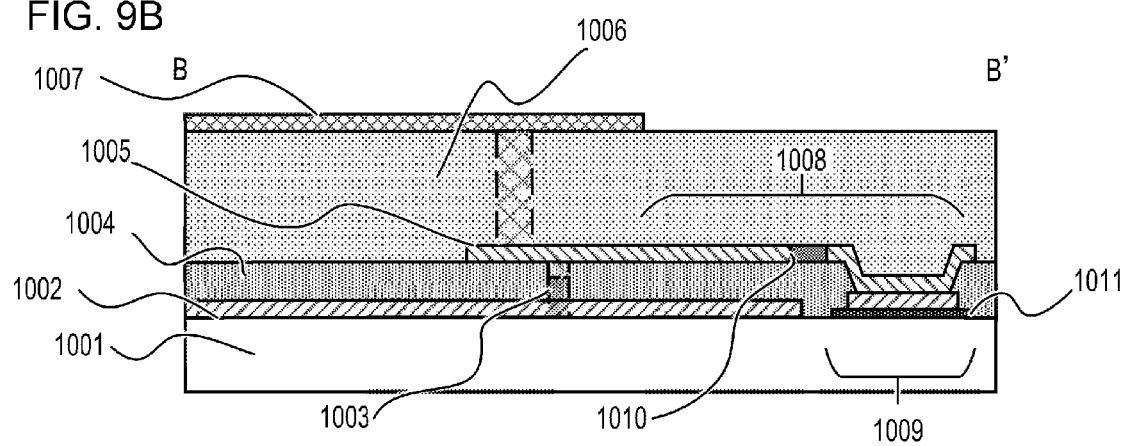

<Fifth Embodiment>: An oscillating element 1000 that is a semiconductor element according to the fifth embodiment will be described with reference to FIGS. 9A and 9B. FIG. 9A is a top view of the oscillating element 1000 having 2×2 antennas. FIG. 9B is a cross-sectional view taken along the line B-B' indicated in FIG. 9A. Note that, also in the present embodiment, a coupling line and a bias line are arranged in different layers.

The oscillating element 1000 includes a substrate 1001, a first conductor layer 1002 (ground metal (GND)), a negative resistance element 1003, a second dielectric layer 1004, and a third conductor layer 1005 (microstrip line (MSL) coupling line). The oscillating element 1000 also includes a first dielectric layer 1006 and a second conductor layer 1007.

In the present embodiment, the second dielectric layer 1004 is interposed between the third conductor layer 1005 and the first conductor layer 1002 to form the coupling line.

Further, the oscillating element 1000 may have a shunt structure 1008 (filter unit), but the shunt structure 1008 is not an essential configuration. The shunt structure 1008 has a capacitor part 1009 and a resistor part 1010. The capacitor part 1009 has a MIM structure in which a high dielectric constant layer 1011 is interposed between a conductive substrate 1001 and a conductor layer which is formed at the same time when the first conductor layer 1002 is formed.

In the present embodiment, the third conductor layer 1005 for synchronizing the second conductor layer 1007 with the phase of the adjacent antenna is formed in a layer different from the second conductor layer 1007, thereby increasing the degree of freedom of design and thus making it possible to arrange a plurality of antennas in an array.

As the substrate 1001, an n⁺InP substrate is used. In the substrate 1001, the InP substrate includes a semiconductor multilayer film that produces a terahertz wave, and has an electromagnetic wave gain in a frequency range of terahertz waves.

As the negative resistance element 1003, for example, a resonance tunnel diode (RTD) or a Gunn diode can be used, and in the present embodiment, the negative resistance element 1003 is formed of an RTD.

The substrate 1001 is connected to the first conductor layer 1002 by ohmic contact, and on the cathode side, a structure is used in which the first conductor layer 1002 is connected to the negative resistance element via the substrate 1001. On the anode side, the bias line is connected to the second conductor layer 1007, and the second conductor layer 1007 is connected to the negative resistance element 1003 via the third conductor layer 1005. Thus, in the present embodiment, the bias line (fourth conductor layer) is formed in the same layer as the second conductor layer 1007. Applying a bias to the negative resistance element 1003 makes it possible to obtain terahertz wave oscillation by the second conductor layer 1007, the negative resistance element 1003, and the third conductor layer 1005, which act as a resonator.

In order to control the phases of the electromagnetic waves oscillating at the adjacent antennas, the negative resistance element 1003 is connected between the adjacent antennas by the third conductor layer 1005 (MSL coupling line). Here, the negative resistance element 1003 (antenna) is located at the maximum point of the electric field of the electromagnetic wave standing in the third conductor layer 1005, so that the phases of the electromagnetic waves produced at the antennas are synchronized.

Further, the length of the third conductor layer 1005 and the size of the second conductor layer 1007 are important parameters for determining the frequency of an electromagnetic wave to oscillate. The length of the third conductor layer 1005 (MSL coupling line) in the resonance direction may be set to an integral multiple of the effective wavelength λ of the desired oscillation wavelength, and the length of the second conductor layer 1007 in the resonance direction may be set to ½ of the effective length of the desired oscillation wavelength λ.

In FIG. 9A, the antennas of the oscillating element 1000 are arranged in 2 rows×2 columns. Here, the third conductor layer 1005 is wired so that L1=effective wavelength λ and L2=λ/2, and the negative resistance element 1003 is located at a distance of λ/2 from the distal end of the third conductor layer 1005. Further, the negative resistance elements 1003 of the adjacent antennas are located at the maximum points of the electric field of the standing electromagnetic wave as described above, that is, at a distance of an integral multiple of λ from each other. In other words, in the oscillating element 1000, the antennas are arranged at a pitch that is an integral multiple of λ.

In the present embodiment, since the RTD element having a gain from a low frequency to about 2 THz is used as the negative resistance element 1003, oscillation (parasitic oscillation) at a frequency other than the desired frequency may occur. In this respect, it is preferable to form a filter in order to suppress parasitic oscillation. For example, in order to suppress parasitic oscillation, there is known a method of suppressing parasitic oscillation by inserting a resistor having a resistance value not more than the absolute value of the negative resistance into the minimum point of the current of the electromagnetic wave standing in the third conductor layer 1005 to cause a loss in electromagnetic waves with a frequency other than the desired frequency. In the present embodiment, as illustrated in FIGS. 9A and 9B, the shunt structure 1008 using a λ/4 wire, MIM capacitor and resistor is located. The λ/4 wire is connected to the minimum point of the electric field of the electromagnetic wave standing in the third conductor layer 1005, and is connected to the first conductor layer 1002 via the resistor part 1010 having a resistance value not more than the absolute value of the negative resistance and the capacitor part 1009 having a sufficiently high capacitance. At the part of the shunt structure 1008 in contact with the third conductor layer 1005, the impedance becomes high at the desired oscillation frequency, making it difficult for a current to flow into the shunt structure 1008. However, the impedance becomes low at a frequency other than the desired oscillation frequency, making it easy a current to flow through the shunt structure and thus causing a loss in the resistor part 1010, so that parasitic oscillation can be suppressed. In this way, stable oscillation can be obtained by properly locating the filter.

By connecting to the adjacent antenna by the third conductor layer 1005 formed between the first conductor layer 1002 and the second conductor layer 1007 in this way, the antennas can be arranged in an array. As a result, the antennas can be arranged at the pitch of effective wavelength, and the directivity of the electromagnetic wave can be improved.

Figure 10:
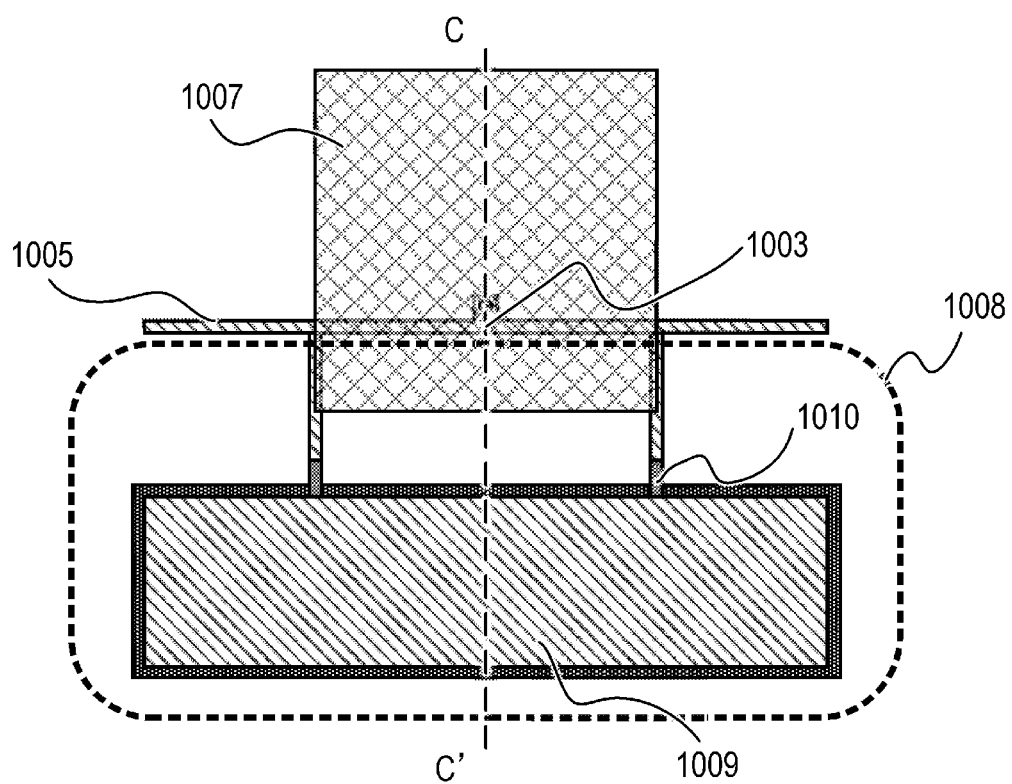
FIG. 10 is a diagram illustrating an oscillating element according to a second example.
Figure 11A:
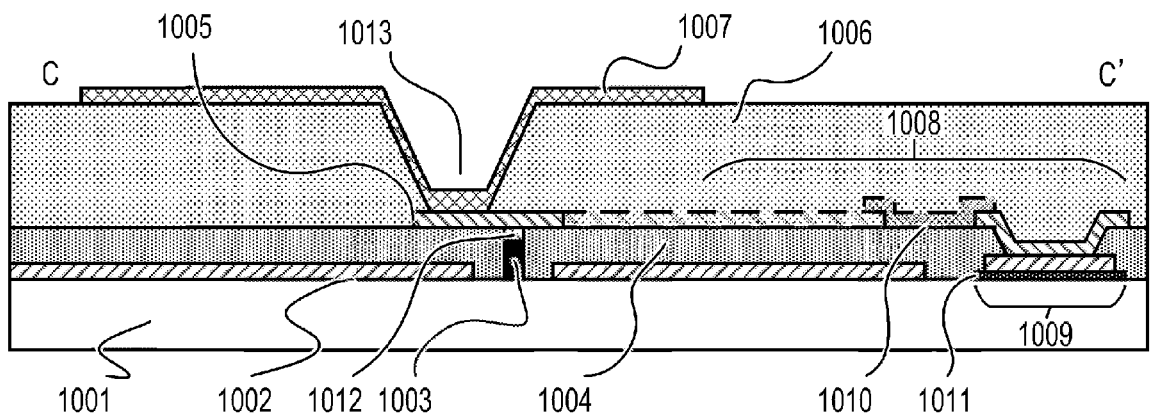
FIGS. 11A and 11B are diagrams illustrating the oscillating element according to the second example.
Figure 11B:
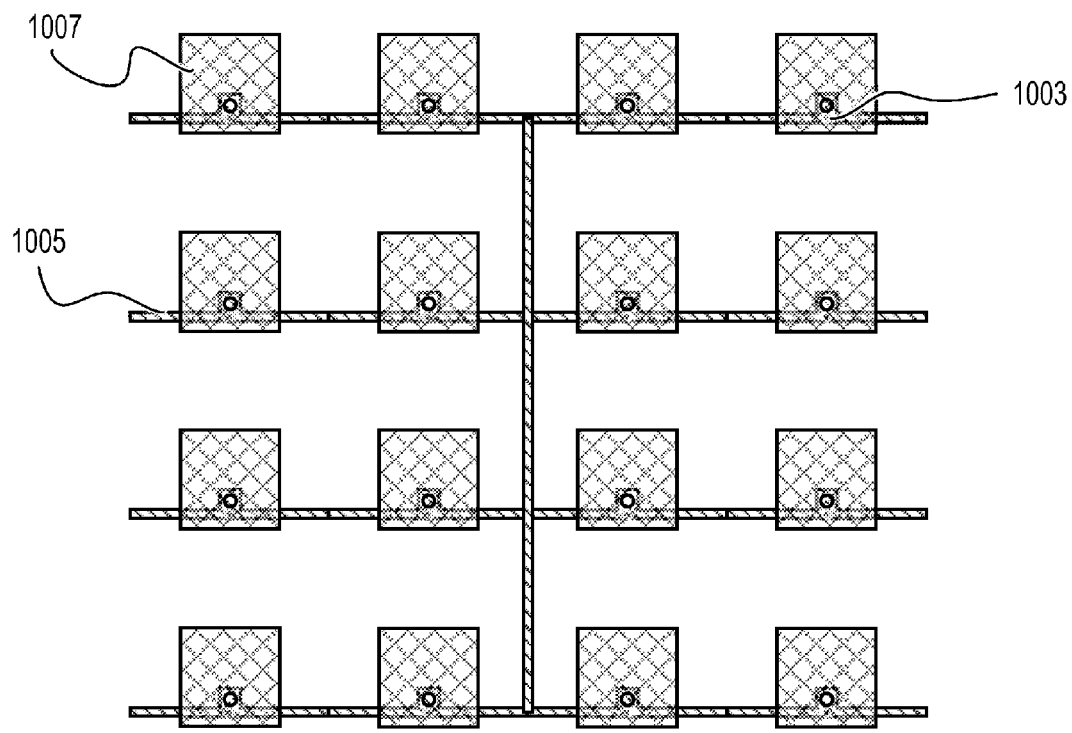

(Second Example): A specific second example of the oscillating element 1000 according to the fifth embodiment will be described with reference to FIGS. 10, 11A and 11B. FIG. 10 is a top view of one antenna included in the oscillating element 1000. FIG. 11A is a cross-sectional view taken along the C-C' section indicated in FIG. 10. FIG. 11B is a top view in which antennas are arranged in a 4×4 array. For simplification, the substrate 1001 and the first conductor layer 1002 are not illustrated in FIGS. 10 and 11B, and the shunt structure 1008 is not illustrated in FIG. 11B.

In the present example, the oscillating element 1000 of the 4×4 antenna illustrated in FIG. 11B is realized by arranging the antennas each corresponding to the single antenna illustrated in FIG. 10 in an array at intervals of the effective wavelength λ. Note that the oscillating element 1000 having m×n antennas (m and n are integers) can be realized by arranging the antennas in the same manner as illustrated in FIG. 11B.

First, one antenna illustrated in FIG. 10 will be described. Here, important parameters for determining the oscillation frequency of the oscillating element include, for example, the length of the second conductor layer 1007 in the resonance direction and the length of the third conductor layer 1005 in the resonance direction, as well as the dielectric constant of each dielectric layer. Note that, in the present example, silicon dioxide formed by plasma CVD is used for the second dielectric layer 1004. Further, BCB (benzocyclobutene) is used for the first dielectric layer 1006.

As a result of calculation using the electromagnetic field simulator HFSS commercially available from ANSYS, Inc. in order to estimate an oscillation frequency for the present example, the effective wavelength λ for obtaining an oscillation frequency of 500 GHz was 320 μm. Therefore, the length of the second conductor layer 1007 in the resonance direction may be set to 160 μm which is ½ of the effective wavelength λ, and the length of the third conductor layer 1005 in the resonance direction may be set to 320 μm which is the effective wavelength λ.

Figure 12:
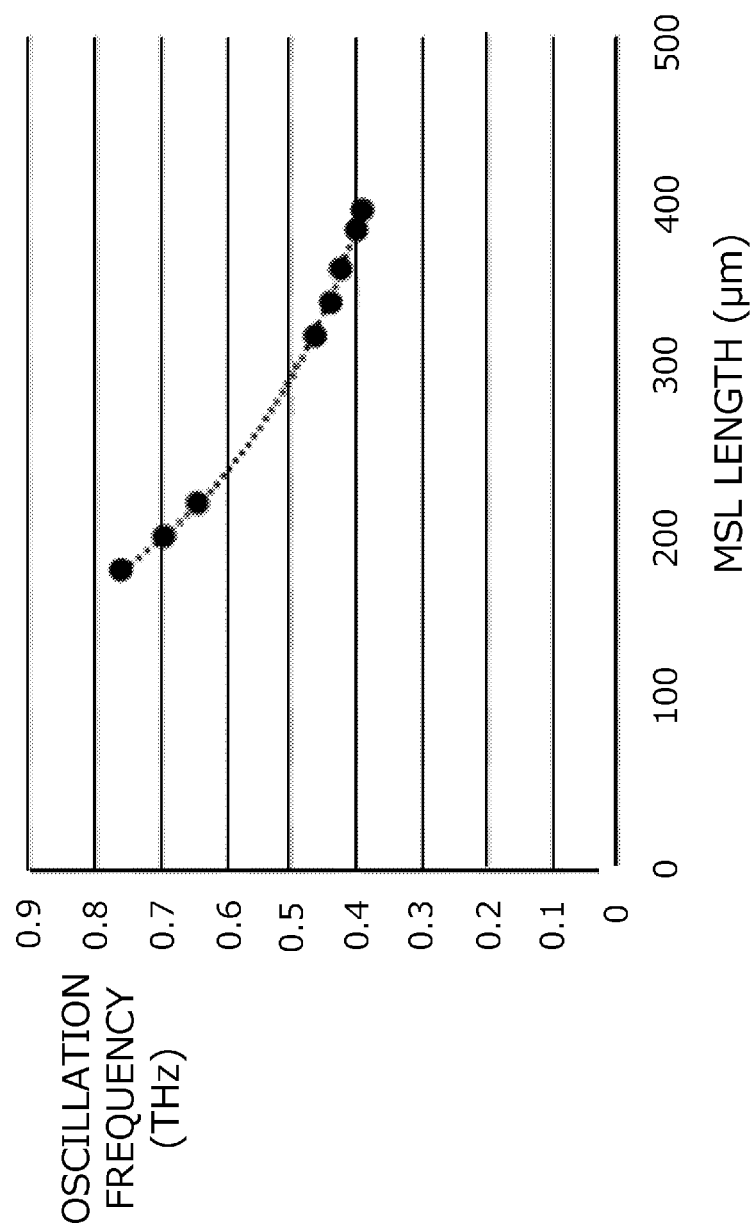
FIG. 12 is a graph of the relationship between third conductor layer and oscillation frequency.

FIG. 12 illustrates a plot of the relationship between the length of the third conductor layer 1005 (MSL) in the resonance direction and the actual oscillation frequency. In this plot, the length of the patch antenna in the resonance direction is ½ of the length of the third conductor layer 1005 in the resonance direction. When the length of the third conductor layer 1005 in the resonance direction is 320 μm, the resulting oscillation frequency is 460 GHz to 479 GHz, which is close to the above-mentioned 500 GHz.

Further, important parameters for determining the oscillation output of the oscillating element include, for example, a parasitic capacitance between a set of the substrate 1001 and the first conductor layer 1002 and a set of the third conductor layer 1005 and the second conductor layer 1007, as well as the characteristics of the negative resistance element 1003. Further, the position of the negative resistance element 1003 in the second conductor layer 1007 is also included in the important parameters. In the present example, the area of the third conductor layer 1005 and the dielectric constant and film thickness of the second dielectric layer 1004 are significant influential factors. Therefore, in order to reduce the parasitic resistance, the width of the MSL coupling line is made as narrow as possible, and the film thickness of the second dielectric layer 1004 is made thick.

Further, the impedance of the negative resistance element 1003 used in the present example is 50 to 60Ω. Here, in order to make the impedance matching between the second conductor layer 1007 and the negative resistance element 1003, the feeding point impedance of the second conductor layer 1007 matches the impedance of the negative resistance element 1003.

Figure 13A:
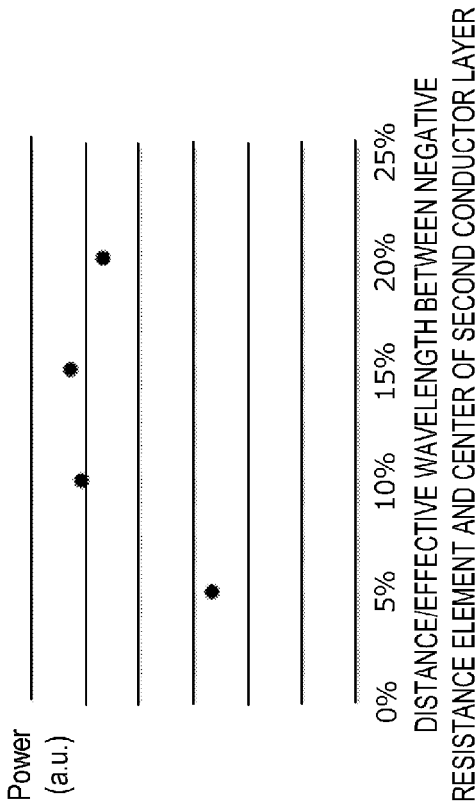
FIGS. 13A to 13C are graphs showing the influences of the oscillating output of the oscillating element.
Figure 13B:
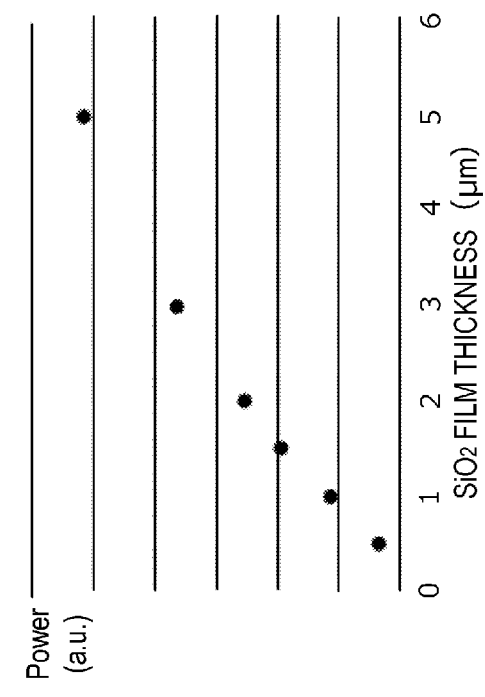
Figure 13C:
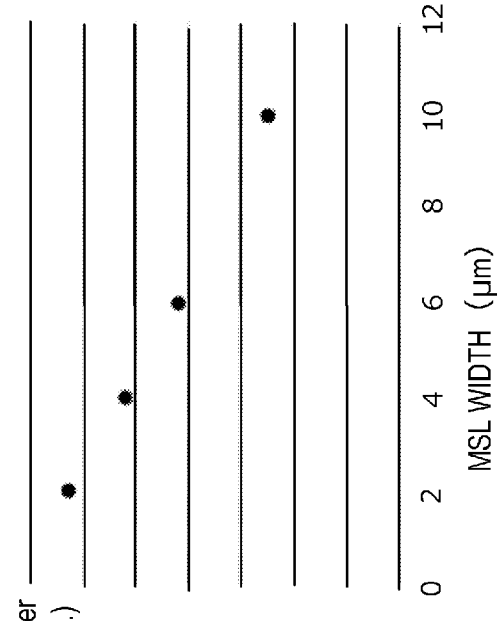
Figure 15:
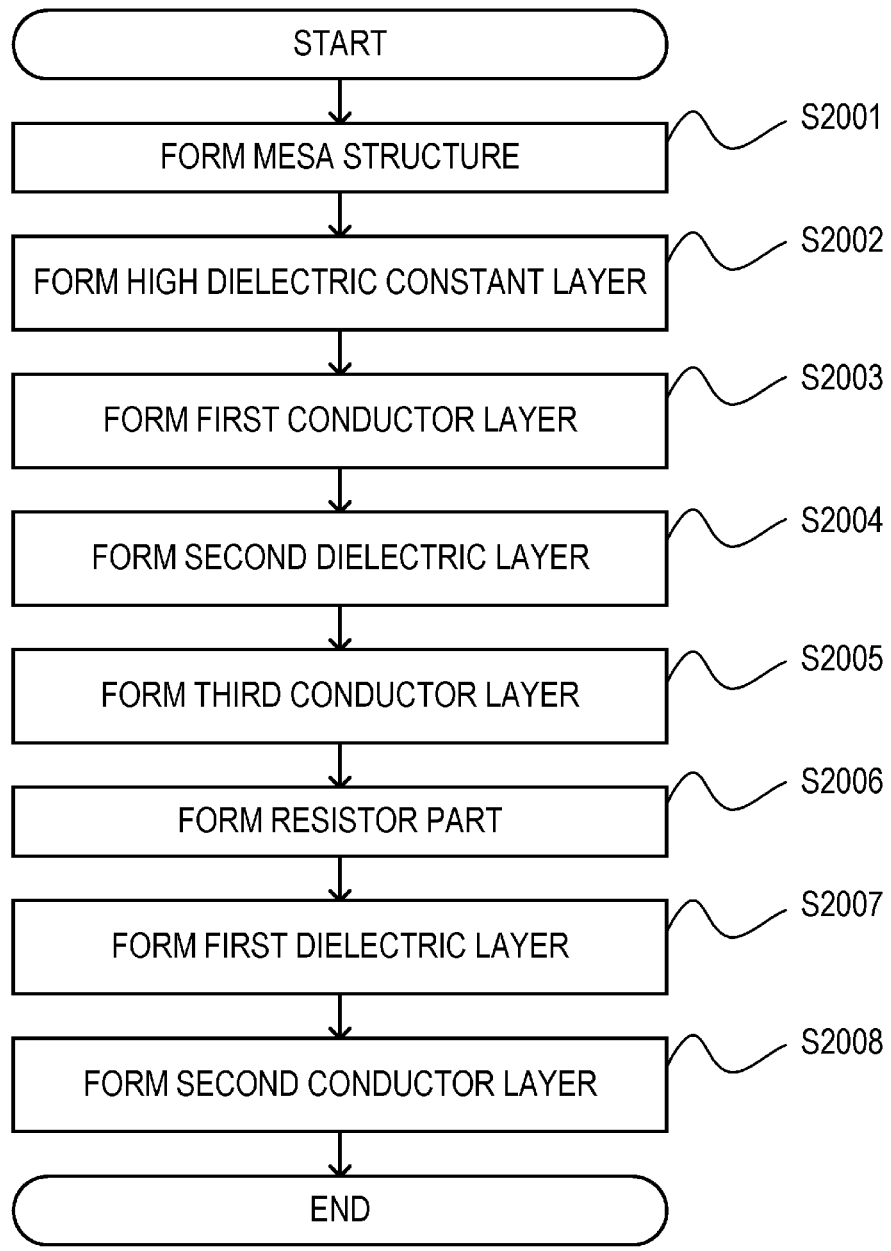
FIG. 15 is a flowchart illustrating a method for manufacturing the oscillating element according to the second example.

FIG. 13A illustrates a calculation of the influence of the thickness of the silicon dioxide film forming the second dielectric layer 1004 on the oscillation output. FIG. 13B illustrates a calculation of the influence of the width of the third conductor layer 1005 (MSL) on the oscillation output. Further, FIG. 13C illustrates a calculation of the influence of the distance between the negative resistance element 1003 and the center of the second conductor layer 1007 on the oscillation output. In the present example, the thickness of the silicon dioxide film was set to 2 μm, the width of the third conductor layer 1005 was set to 4 μm, and the value obtained by dividing the distance between the negative resistance element 1003 and the center of the second conductor layer 1007 by the effective wavelength was set to 15%.

Further, in order to realize the oscillating element 1000 of the present example, parasitic oscillation at a frequency other than the desired oscillation frequency is suppressed. Accordingly, the shunt structure 1008 is located so as not to cause a loss in an electromagnetic wave in a state of oscillating at a desired oscillation frequency, and to not produce oscillating electromagnetic waves with a loss at a frequency other than the desired frequency. As described above, in the present example, in order to suppress parasitic oscillation, a MIM capacitor with a sufficiently high capacitance is connected to the third conductor layer 1005 via a resistor of 20Ω, which is an absolute value of the negative resistance of the negative resistance element 1003 of 50Ω or less, and a wire with a λ/4 length. The location point of the λ/4 length wire in the third conductor layer 1005 is connected to a node of the electric field of the electromagnetic wave standing at the desired frequency. In other words, in the present example, it is connected at a distance of λ/4 from the distal end of the third conductor layer 1005. As a result, parasitic oscillation can be suppressed and an oscillating element with a desired oscillation frequency can be obtained.

Further, as illustrated in FIG. 11A, the central axis of a conductor 1012 and the central axis of a contact hole 1013 are displaced from each other in the stacking direction. The conductor 1012 is an electrode formed in a contact hole in which the second dielectric layer 1004 on the negative resistance element 1003 is removed, for electrically connecting the negative resistance element 1003 and the third conductor layer 1005. The contact hole 1013 is a hole that penetrates the second dielectric layer 1004 (a part of the dielectric layer in which the first dielectric layer 1006 and the second dielectric layer 1004 are combined) in the stacking direction. By forming a part of the second conductor layer 1007 on the surface of the contact hole 1013, the third conductor layer 1005 and the second conductor layer 1007 are connected to each other. Note that the central axes of the conductor 1012 and the contact hole 1013 may be aligned with each other. However, in the present example, in order to protect the negative resistance element 1003, the two central axes are displaced from each other so that an upper part of the negative resistance element 1003 (in the stacking direction) is covered with the first dielectric layer 1006 which is a protective film.

By setting the parameters in this way, an output of 460 GHz, 50 µW was obtained with the single antenna of the present example.

Further, as illustrated in FIG. 11B, the oscillating element 1000 having 4×4 antennas can be realized by arranging the antennas corresponding to the above-mentioned single antenna in an array at the pitch of effective wavelength.

FIG. 14 illustrates oscillation outputs when a voltage is applied to the oscillating element 1000. In FIG. 14, the broken line is an oscillation output obtained by one antenna, and the solid line is an oscillation output obtained by 4×4 (16) antennas. Here, for the 4×4 antennas, the oscillation output is 830 µW, and the oscillation frequency is 458 GHz, which is about 16 times the output obtained by the single antenna. By the third conductor layer 1005 formed between the second conductor layer 1007 and a set of the substrate 1001 and the first conductor layer 1002 in this way, the adjacent antennas are connected and arranged in an array, so that the phases of the electromagnetic waves oscillating at the antennas can be synchronized.

(Manufacturing Method): Next, a method for manufacturing (method for producing) of the oscillating element 1000 according to the present example will be described with reference to a flowchart of manufacturing steps of FIG. 15 and FIGS. 16A to 16H. Here, FIGS. 16A to 16H are cross-sectional views of the antenna (oscillating element 1000) in the respective manufacturing steps, and each illustrate a cross-sectional view taken along the C-C' in FIG. 10.

Figure 16A:
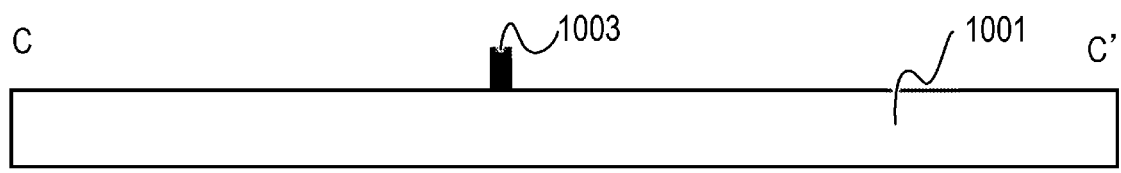
FIGS. 16A to 16H are diagrams illustrating steps of processing of manufacturing the oscillating element according to the second example.

In S2001, as illustrated in FIG. 16A, the negative resistance element 1003 is formed. More specifically, a semiconductor multilayer film formed by epitaxial growth on an InP substrate doped with a high concentration of dopant and an electrode for ohmic contact are processed into a mesa shape. The semiconductor multilayer film including the negative resistance element 1003 is formed of InGaAs, AlAs, or the like. The electrode for contact is formed of a metal such as Mo, W, Ti, Ta, Al, Cu, and Au, an alloy thereof, a semiconductor doped with the same concentration, and a laminated film thereof. The subsequent processing method uses known semiconductor device steps. In the present example, a Mo electrode is formed by sputtering on a semiconductor multilayer film formed by epitaxial growth, a resist having a desired shape is formed by a photolithography step, and then dry etching is performed with chlorine-based gas.

Figure 16B:
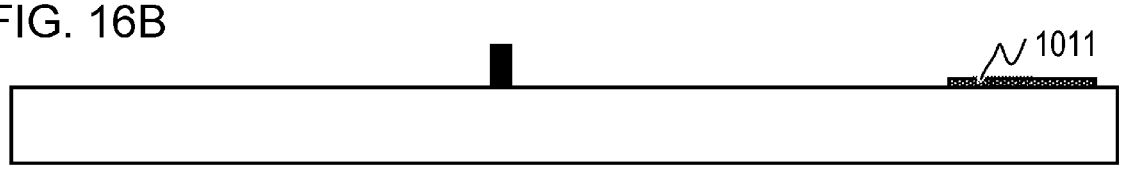

In S2002, as illustrated in FIG. 16B, the high dielectric constant layer 1011, which is a MIM capacitor, is formed. In order to reduce the area of the MIM capacitor, it is desirable that the high dielectric constant layer 1011 is made of a high dielectric constant material such as silicon nitride and aluminum oxide. In the present example, a silicon nitride film is formed by plasma CVD, a resist having a desired shape is formed by a photolithography step, and then dry etching is performed with fluorine-based gas.

Figure 16C:
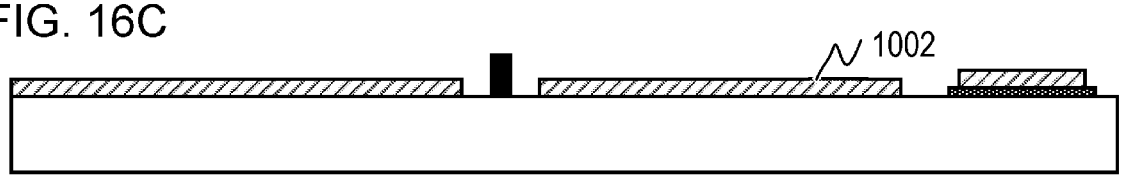

In S2003, as illustrated in FIG. 16C, the first conductor layer 1002 is formed. The first conductor layer 1002 is formed of a metal such as Mo, W, Ti, Ta, Al, Cu, and Au, an alloy thereof, a semiconductor doped with the same concentration, and a laminated film thereof. At this time, an upper electrode of the MIM capacitor is also formed at the same time as the first conductor layer 1002. The first conductor layer 1002 is formed so as to make ohmic contact with the substrate 1001. In the present example, a Mo electrode is formed by sputtering, a resist having a desired shape is formed by a photolithography step, and then dry etching is performed with chlorine-based gas. Further, although not illustrated, the mesa structure is protected by the high dielectric constant layer formed in S2002 during etching of S2003.

Figure 16D:
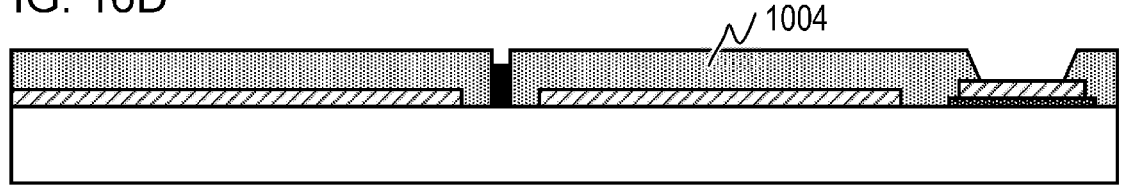

In S2004, as illustrated in FIG. 16D, the second dielectric layer 1004 is formed. It is desirable that the second dielectric layer 1004 is made of a low dielectric constant material such as silicon dioxide, BCB, acrylic resin, and polyimide in order to reduce the parasitic capacitance between a set of the substrate 1001 and the first conductor layer 1002 and the third conductor layer 1005. In the present example, a silicon dioxide film is formed by plasma CVD, a resist having a desired shape is formed by a photolithography step, and then dry etching is performed with fluorine-based gas. By this dry etching, a contact hole for forming the conductor 1012 is formed in the next step.

Figure 16E:
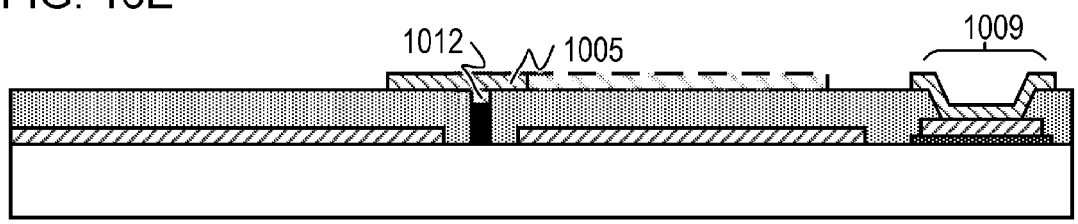

In S2005, as illustrated in FIG. 16E, the conductor 1012 and the third conductor layer 1005 (MSL) are formed. The third conductor layer 1005 is formed of a metal such as Mo, W, Ti, Ta, Al, Cu, and Au, an alloy thereof, a semiconductor doped with the same concentration, and a laminated film thereof. In the present example, an Au/Ti laminated electrode is formed by sputtering, a resist having a desired shape is formed by a photolithography step, and then wet etching is performed.

Figure 16F:
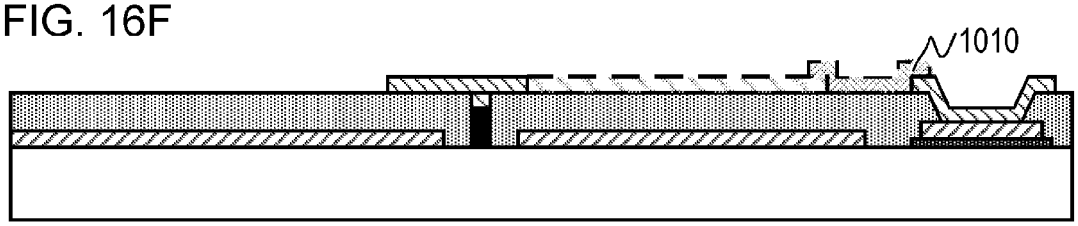

In S2006, as illustrated in FIG. 16F, the resistor part 1010 is formed. As described above, the resistance of the resistor part 1010 is preferably not more than the absolute value of the negative resistance of the negative resistance element 1003. In the present example, a WTi alloy is used for the resistor part 1010 in order to set the resistance of the resistor part 1010 to several $\Omega$ to several tens of $\Omega$. Examples of other materials that can be used for the resistor part 1010 include a metals such as Ti, TiN, Ta, Mo, and W, an alloy thereof, a semiconductor doped with the same concentration, and a laminated film thereof. In the present example, a WTi electrode is formed by sputtering, a resist having a desired shape is formed by a photolithography step, and then dry etching is performed with fluorine-based gas.

Figure 16G:
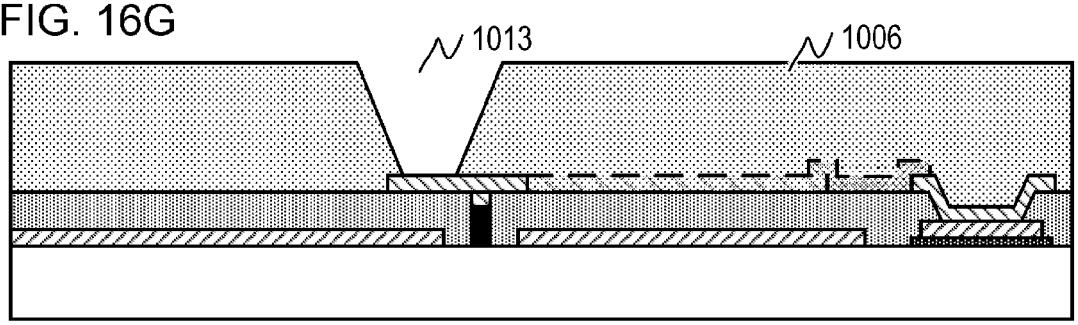

In S2007, as illustrated in FIG. 16G, the first dielectric layer 1006 is formed. It is desirable that the first dielectric layer 1006 is made of a low dielectric constant material such as silicon dioxide, BCB, acrylic resin, and polyimide in order to reduce the parasitic capacitance between a set of the substrate 1001 and the first conductor layer 1002 and the second conductor layer 1007. Further, the contact hole 1013 is also formed at this time, but it is formed so that the central axis of the contact hole 1013 and the central axis of the conductor 1012 are not aligned in the stacking direction. In other words, the contact hole 1013 is formed so that a part in the stacking direction of the conductor 1012 is maintained in a state of being covered with the first dielectric layer 1006. In the example, a photosensitive BCB was formed by coating, and a desired shape of the first dielectric layer 1006 was obtained by a photolithography step.

Figure 16H:
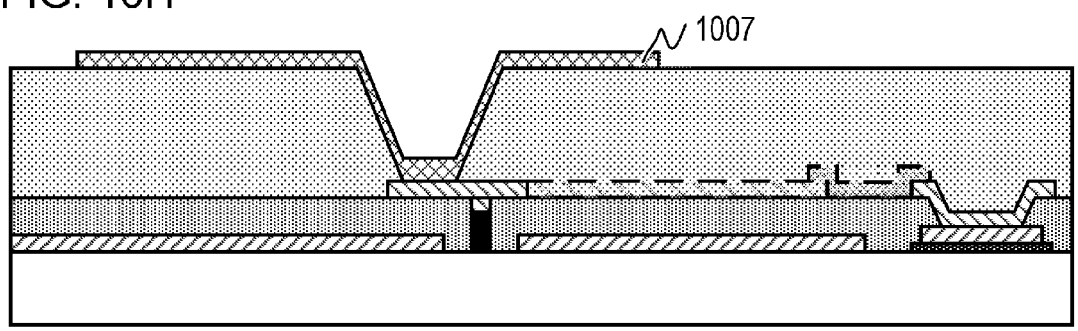

In S2008, as illustrated in FIG. 16H, the second conductor layer 1007 is formed. The second conductor layer 1007 is formed of a metal such as Mo, W, Ti, Ta, Al, Cu, and Au, an alloy thereof, a semiconductor doped with the same concentration, and a laminated film thereof. In the present example, an Au/Ti laminated electrode is formed by sputtering, a resist having a desired shape is formed by a photolithography step, and then wet etching is performed.

By forming antennas in this way, arranging them in an array, and connecting the resulting elements by the third conductor layer 1005 (MSL), the phases of the electromagnetic waves produced at the antennas can be synchronized.

Figure 17A:
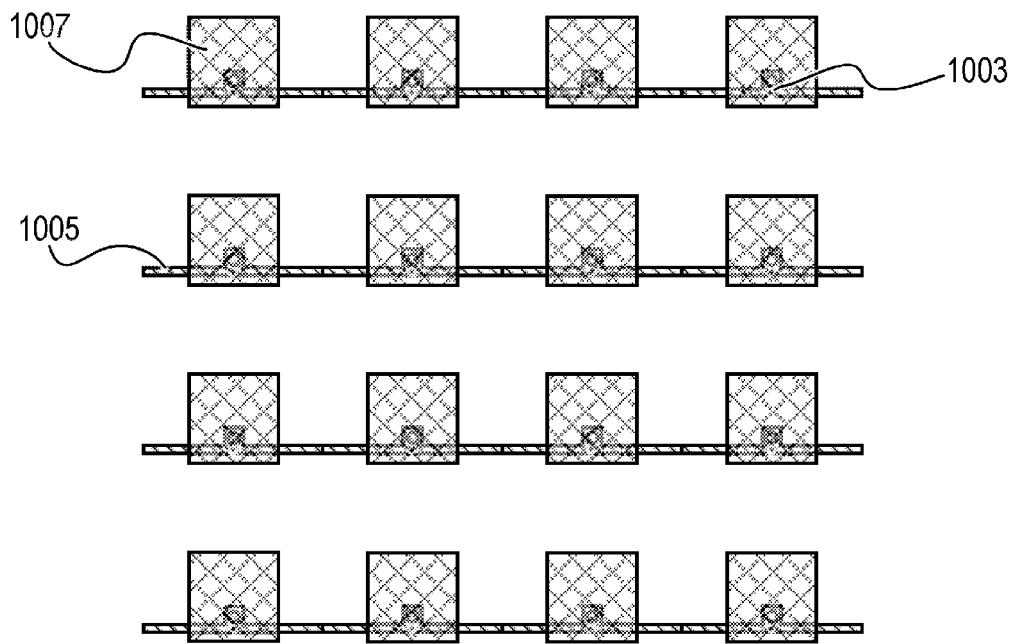
FIG. 17A is a diagram illustrating an oscillating element according to a third example.

(Third Example): A third example, which is a modification of the second example, will be described with reference to FIG. 17A. For simplification, in FIG. 17A, the substrate 1001 and the first conductor layer 1002 and the shunt structure 1008 are not illustrated. Further, each antenna of the present example has the same configuration as that of the second example. The present example is an example different from the second example in the antenna connection method.

For the connection between the antennas, the connection in the direction of rows is the same as in FIG. 11B of the second example. On the other hand, for the connection in the direction of columns, the adjacent antennas arranged in the direction of columns at the pitch of effective wavelength λ are mutually coupled by an electromagnetic wave propagating through a space or an insulating film, instead of the connection using the third conductor layer 1005. By arranging the antennas in an array in this way, and connecting the resulting elements by the third conductor layer 1005, the phases of the electromagnetic waves produced at the antennas can be synchronized. As a result, the antennas can be arranged at the pitch of effective wavelength, and the directivity of the electromagnetic wave can be improved.

Figure 17B:
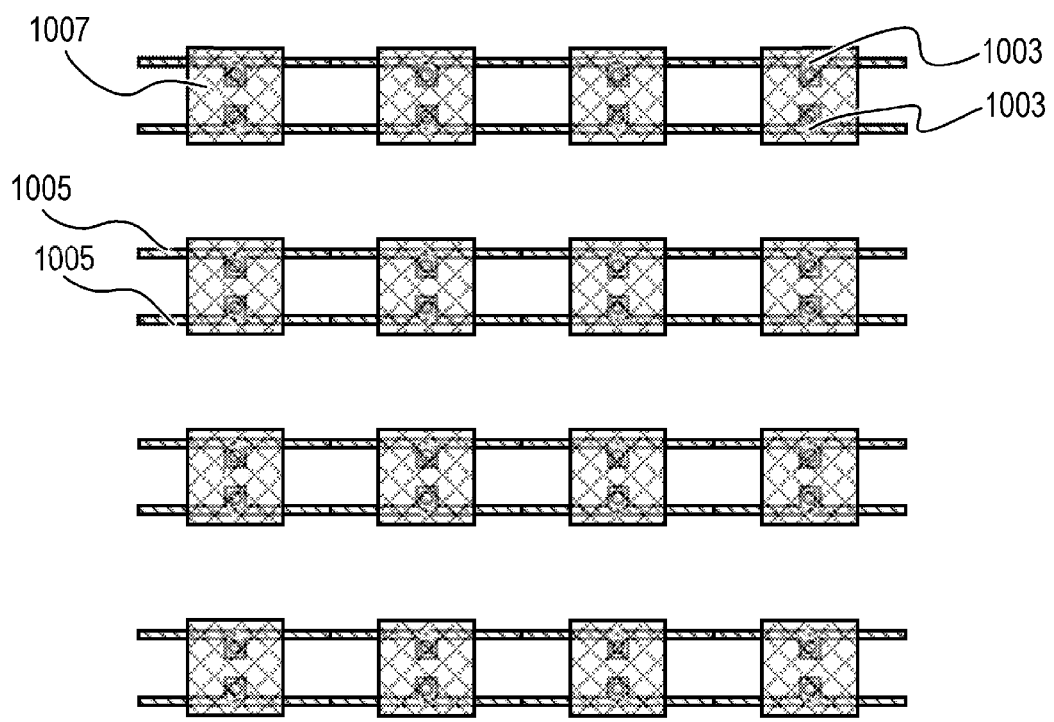
FIG. 17B is a diagram illustrating an oscillating element according to a fourth example.

(Fourth Example): A fourth example, which is a modification of the third example, will be described with reference to FIG. 17B. For simplification, in FIG. 17B, the substrate 1001 and the first conductor layer 1002 and the shunt structure 1008 are not illustrated. The present example is an example of a connection method for one antenna having a plurality of negative resistance elements. In the present example, as in the third embodiment, for the connection in the direction of columns, the adjacent antennas arranged in the direction of columns at the pitch of effective wavelength λ are mutually coupled by an electromagnetic wave propagating through a space or an insulating film, instead of the connection using the third conductor layer 1005. In the present example, two negative resistance elements are located in one patch antenna, and they are driven in a state where their phases are inverted from each other.

By arranging the antennas, in which a plurality of negative resistance elements are located, in an array in this way, and connecting the resulting elements by the third conductor layer 1005, the phases of the electromagnetic waves produced at the antennas can be synchronized. As a result, the antennas can be arranged at the pitch of effective wavelength, and the directivity of the electromagnetic wave can be improved.

(Other Embodiments): Although the preferred embodiments of the present invention have been described above, the present invention is not limited to these embodiments, and various modifications and changes can be made within the scope and spirit of the invention.

For example, in the above-described embodiments and examples, the case where the carrier is an electron is described, but the present invention is not limited to this, and a hole may be used. Further, the materials of the substrate and the dielectric may be selected according to the application, and semiconductor layers such as silicon, gallium arsenide, indium arsenide, and gallium phosphide; glass; ceramics; and resins such as polytetrafluoroethylene and liethylene terephthalate may be used.

Further, in the above-described embodiments and examples, a terahertz wave resonator with a square patch antenna is used, but the shape of the resonator is not limited to this. For example, a resonator having a structure using a patch conductor having a polygon such as a rectangle and a triangle, a circle, or an ellipse shape may be used.

Further, the number of differential negative resistance elements integrated in the semiconductor element is not limited to one, and the resonator may have a plurality of differential negative resistance elements. The number of lines is not limited to one, and a plurality of lines may be formed. The semiconductor elements described in the above-described embodiments and examples make it possible to produce oscillating terahertz waves and to detect terahertz waves.

Further, in each of the above-described embodiments, as the RTD, a double barrier RTD formed of InGaAs/AlAs grown on an InP substrate has been described. However, the semiconductor element according to the present invention can be provided not only by such structure and material base but also by combinations of other structures and materials. For example, an RTD having a triple barrier quantum well structure or an RTD having a quadruple or more multiple barrier quantum well may be used.

Further, as the material of the RTD, any one of the following combinations may be used.
Materials formed on a GaAs substrate, such as GaAs/AlGaAs, GaAs/AlAs, and InGaAs/GaAs/AlAs
Materials formed on an InP substrate, such as InGaAs/InAlAs, InGaAs/AlAs, and InGaAs/AlGaAsSb
Materials formed on an InAs substrate, such as InAs/AlAsSb and InAs/AlSb
Materials formed on a Si substrate, such as SiGe/SiGe The above-mentioned structures and materials may be appropriately selected according to a desired frequency and the like.

According to the present invention, it is possible to provide efficient generation or detection of a terahertz wave in an element having an antenna array structure.

The present invention is not limited to the above embodiments, and various changes and modifications can be made without departing from the spirit and scope of the present invention. Therefore, the following claims are annexed in order to publicize the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:
1. An element comprising:
an antenna array in which a plurality of antennas are arranged, with each of the antennas including
a first conductor layer,
a semiconductor layer that is electrically connected to the first conductor layer and produces or detects a terahertz wave,
a second conductor layer that is electrically connected to the semiconductor layer and faces the first conductor layer via the semiconductor layer, and
a dielectric layer that is located between the first conductor layer and the second conductor layer;

a coupling line that is connected to the second conductor layer configured to make mutual synchronization between the plurality of antennas at a frequency of the terahertz wave; and a bias line that connects a power source for supplying a bias signal to the semiconductor layer and the second conductor layer, wherein a wiring layer in which the coupling line is formed and a wiring layer in which the bias line is formed are different layers, and the bias line is disposed in a layer between the first conductor layer and the second conductor layer.

2. The element according to claim 1, wherein the coupling line and the bias line cross each other in plan view.

3. The element according to claim 1, further comprising a third conductor layer and a fourth conductor layer, wherein the coupling line is formed of the third conductor layer and the first conductor layer, the bias line is formed of the fourth conductor layer, and the third conductor layer and the fourth conductor layer are arranged in different layers.

4. The element according to claim 3, wherein the third conductor layer and the fourth conductor layer cross each other in plan view.

5. The element according to claim 3, further comprising:

a fifth conductor layer disposed in a layer between a set of the third conductor layer and the fourth conductor layer, and the first conductor layer; and a capacitor structure in which the dielectric layer is interposed between the first conductor layer and the fifth conductor layer.

6. The element according to claim 5, wherein the third conductor layer or the fourth conductor layer, and the fifth conductor layer are electrically connected via a resistor.

7. The element according to claim 3, wherein the first conductor layer, the fourth conductor layer, and the third conductor layer are stacked in this order.

8. An element comprising:

an antenna array in which a plurality of antennas are arranged, with each of the antennas including a first conductor layer, a semiconductor layer that is electrically connected to the first conductor layer and produces or detects a terahertz wave, a second conductor layer that is electrically connected to the semiconductor layer and faces the first conductor layer via the semiconductor layer, and a dielectric layer that is located between the first conductor layer and the second conductor layer;

a coupling line that is connected to the second conductor layer configured to make mutual synchronization between the plurality of antennas at a frequency of the terahertz wave; and a bias line that connects a power source for supplying a bias signal to the semiconductor layer and the second conductor layer, wherein a wiring layer in which the coupling line is formed and a wiring layer in which the bias line is formed are different layers, the element further comprising a third conductor layer and a fourth conductor layer, wherein the coupling line is formed of the third conductor layer and the first conductor layer, the bias line is formed of the fourth conductor layer, the third conductor layer and the fourth conductor layer are arranged in different layers, and the first conductor layer, the third conductor layer, and the fourth conductor layer are stacked in this order.

9. The element according to claim 8, wherein a contact hole that penetrates a part of the dielectric layer in a stacking direction is formed, the second conductor layer and the third conductor layer are connected to each other by formation of a part of the second conductor layer on a surface of the contact hole, and the semiconductor layer that is in a stacking direction is covered with the dielectric layer.

10. The element according to claim 1, wherein the bias line is set to have a lower impedance than an impedance of the semiconductor layer in a frequency band lower than the frequency of the terahertz wave.

11. The element according to claim 1, wherein in the antenna array, the antennas are arranged in a matrix of m×n, where (m≥2, n≥2).

12. The element according to claim 1, wherein the antennas are arranged at a pitch that is an integral multiple of a wavelength of the terahertz wave.

13. The element according to claim 1, wherein each of the antennas is a patch antenna.

14. The element according to claim 1, wherein the semiconductor layer includes a negative resistance element.

15. The element according to claim 14, wherein the negative resistance element is a resonant tunneling diode.

16. An element comprising:

an antenna array in which a plurality of antennas are arranged, with each of the antennas including a first conductor layer, a semiconductor layer that is electrically connected to the first conductor layer and produces or detects a terahertz wave, a second conductor layer that is electrically connected to the semiconductor layer and faces the first conductor layer via the semiconductor layer, and a dielectric layer that is located between the first conductor layer and the second conductor layer;

a coupling line that is connected to the second conductor layer configured to make mutual synchronization between the plurality of antennas at a frequency of the terahertz wave; and a bias line that connects a power source for supplying a bias signal to the semiconductor layer and the second conductor layer, wherein a wiring layer in which the coupling line is formed and a wiring layer in which the bias line is formed are different layers, and adjacent antennas in the antenna array are connected to a common bias line disposed between the adjacent antennas.

17. The element according to claim 16, wherein each of the antennas is connected to the common bias line via a lead wire having a width narrower than a width of the antenna.

* * * * *